United States Patent
Lok

(10) Patent No.: US 12,231,138 B2
(45) Date of Patent: Feb. 18, 2025

(54) ANALOG-TO-DIGITAL CONVERTER (ADC) WITH REFERENCE ADC PATH RECEIVING ATTENUATED INPUT TO GENERATE ERROR CODES FOR SECOND AND THIRD HARMONICS BY COUNTING NEGATIVE AND POSITIVE CODES

(71) Applicant: Caelus Technologies Limited, Hong Kong (HK)

(72) Inventor: Chi Fung Lok, Hong Kong (HK)

(73) Assignee: Caelus Technologies Limited, Hong Kong (HK)

( * ) Notice: Subject to any disclaimer, the term of this patent is extended or adjusted under 35 U.S.C. 154(b) by 155 days.

(21) Appl. No.: 18/206,203

(22) Filed: Jun. 6, 2023

(65) Prior Publication Data
US 2024/0413831 A1    Dec. 12, 2024

(51) Int. Cl.
*H03M 1/06*    (2006.01)
*H03M 1/12*    (2006.01)

(52) U.S. Cl.
CPC ....... *H03M 1/0609* (2013.01); *H03M 1/0614* (2013.01); *H03M 1/1255* (2013.01)

(58) Field of Classification Search
CPC .......... H03M 1/06; H03M 1/12; H03M 1/121; H03M 1/1009; H03M 1/1215; H03M 1/1052; H03M 1/1255; H03M 1/0614; H03M 1/0609
See application file for complete search history.

(56) References Cited

U.S. PATENT DOCUMENTS 5,465,092 A * 11/1995 Mayes ................ H03M 1/1028
                                                   341/118
6,323,792 B1 * 11/2001 Regier ................ H03M 1/0612
                                                   341/120

(Continued)

OTHER PUBLICATIONS

Danny Luu et al., "Background Calibration using noisy reference ADC for a 12b 600 MS/s x Ti SAR ADC in 14 nm CMOS FinFET", ESSCIRC 2017, IEEE Sep. 11, 2017, pp. 183-186.

(Continued)

*Primary Examiner* — Lam T Mai
(74) *Attorney, Agent, or Firm* — gPatent LLC; Stuart T. Auvinen

(57) ABSTRACT

An interleaved Analog-to-Digital Converter (ADC) has a reference channel receiving an attenuated analog input. The reference channel is also calibrated to remove capacitor-ratio mismatch, static, and dynamic mismatches and produces a linear replica of the data channels with negligible nonlinear errors due to attenuation. Nonlinear errors on the data channels are corrected by Harmonic Distortion HD2 and HD3 coefficients. A counter increments when the sign bit of a nonlinear-corrected channel code is negative. The count is doubled and reduced by a number of samples to generate a HD2 cost function that adjusts the HD2 coefficient in a LMS loop. A HD3 correlation is generated by multiplying the reference channel output by its difference with the nonlinear-corrected channel code. The sign of the correlation code increments a second counter which generates a HD3 cost function whose sign bit adjusts the HD3 coefficient. These 2 counters generate cost functions, eliminating sample storage.

20 Claims, 18 Drawing Sheets

(56) References Cited

U.S. PATENT DOCUMENTS

| | | | | |
|---|---|---|---|---|
| 6,445,319 | B1* | 9/2002 | Bugeja | H03M 1/1038 341/138 |
| 7,348,906 | B2 | 3/2008 | O'Donnell et al. | |
| 7,821,435 | B2 | 10/2010 | Fan et al. | |
| 7,916,051 | B1* | 3/2011 | Sestok | H03M 1/1061 341/120 |
| 8,519,875 | B2* | 8/2013 | Straayer | H03M 1/1057 714/704 |
| 8,749,410 | B1* | 6/2014 | Van Der Goes | H03M 1/06 341/120 |
| 9,143,147 | B1* | 9/2015 | Ray | H03M 1/12 |
| 9,294,112 | B1* | 3/2016 | Devarajan | H03M 1/0836 |
| 9,496,884 | B1* | 11/2016 | Azenkot | H03M 1/1023 |
| 9,722,620 | B1 | 8/2017 | Zanbaghi et al. | |
| 9,748,966 | B2 | 8/2017 | Nagarajan et al. | |
| 10,483,995 | B1* | 11/2019 | Lok | H03M 1/1042 |
| 10,680,632 | B2* | 6/2020 | Sundström | H03M 1/0673 |
| 11,146,282 | B1* | 10/2021 | Lok | H03M 1/462 |
| 11,159,169 | B2 | 10/2021 | Ali et al. | |
| 11,632,121 | B1* | 4/2023 | Lok | H03M 1/0626 341/120 |
| 11,641,210 | B1* | 5/2023 | Lok | H03M 1/0836 341/120 |
| 11,646,747 | B1* | 5/2023 | Lok | H03M 1/0609 341/120 |
| 11,750,160 | B1* | 9/2023 | Lok | H03M 1/164 330/295 |
| 2003/0132867 | A1* | 7/2003 | Ostrom | H03M 1/109 341/120 |
| 2012/0050079 | A1* | 3/2012 | Goldman | H03M 1/0624 341/118 |
| 2013/0027233 | A1* | 1/2013 | Nozaki | H03M 1/12 341/118 |
| 2013/0069812 | A1* | 3/2013 | Waltari | H03M 1/0626 341/166 |
| 2013/0241753 | A1* | 9/2013 | Nozaki | H03M 1/0626 341/118 |
| 2014/0368364 | A1* | 12/2014 | Hsu | H03M 1/0624 341/118 |
| 2015/0303934 | A1* | 10/2015 | Chiu | H03M 1/36 341/120 |
| 2016/0149582 | A1* | 5/2016 | Ragab | H03M 1/121 341/120 |
| 2022/0131549 | A1* | 4/2022 | Huang | H03M 1/1061 |
| 2023/0261661 | A1* | 8/2023 | Lok | H03M 1/1028 341/155 |
| 2023/0327679 | A1* | 10/2023 | Lok | H03M 1/0607 341/120 |
| 2024/0413831 | A1* | 12/2024 | Lok | H03M 1/1255 |

OTHER PUBLICATIONS

Monson H. Hayes, "Statistical Digital Signal Processing and Modeling", Jan. 1996, chapters 2, 7, 9, pp. 7-56, 335-390, 493-570.
EU Search Report, 23199579.6 Apr. 12, 2024.
Si Chen and Boris Murmann, "An 8-bit 1.25GS/s CMOS IF-Sampling ADC with Background Calibration for Dynamic Distortion", IEEE Asian Solid-State Circuits Conference, p. 69-p. 72, Nov. 2016.
Lai Wei et. al., "An Auxiliary-Channel-Sharing Background Distortion and Gain Calibration Achieving >8dB SFDR Improvement over 4th Nyquist Zone in 1GS/s ADC", IEEE Symposium on VLSI Circuits Digest of Technical Papers, Jun. 2021.

* cited by examiner

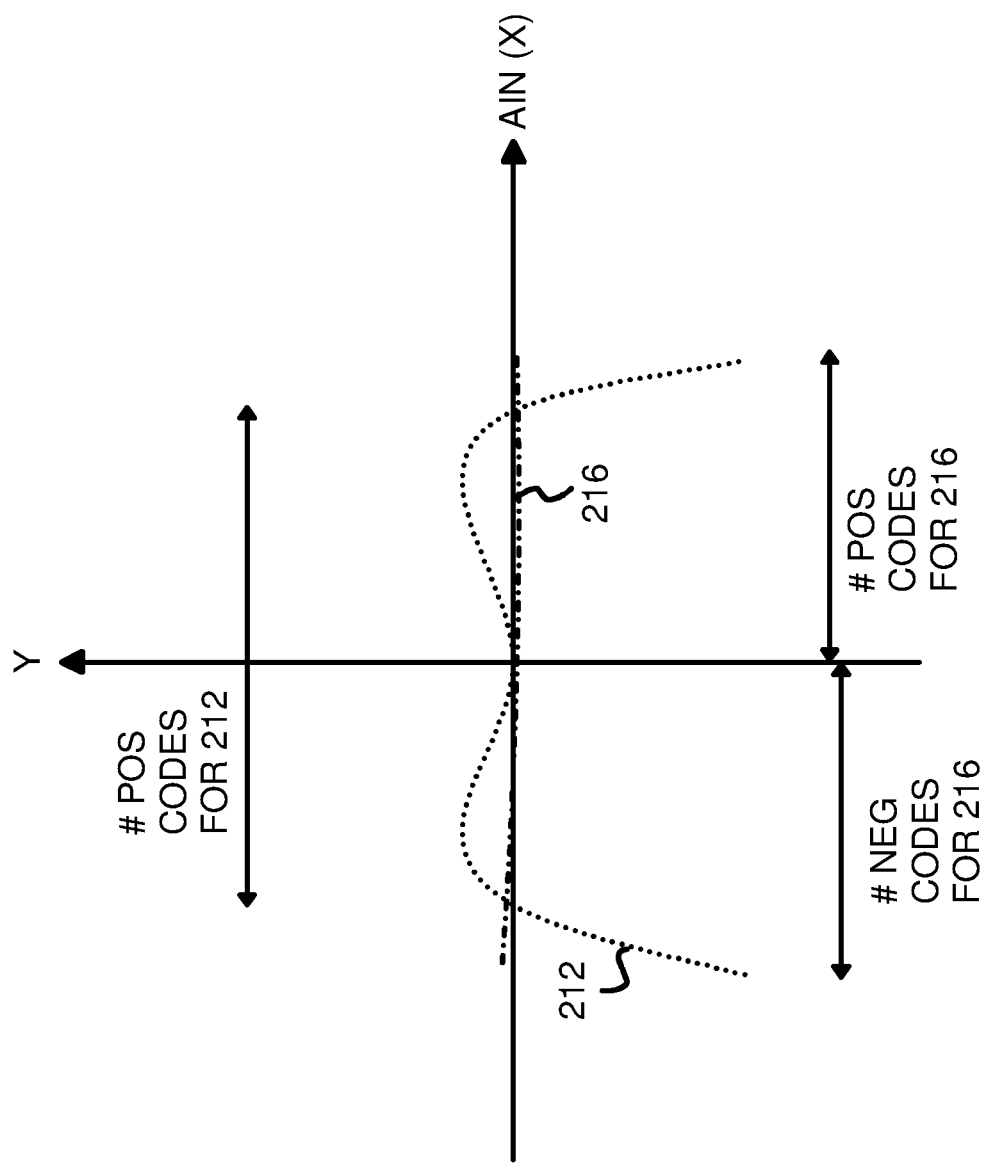

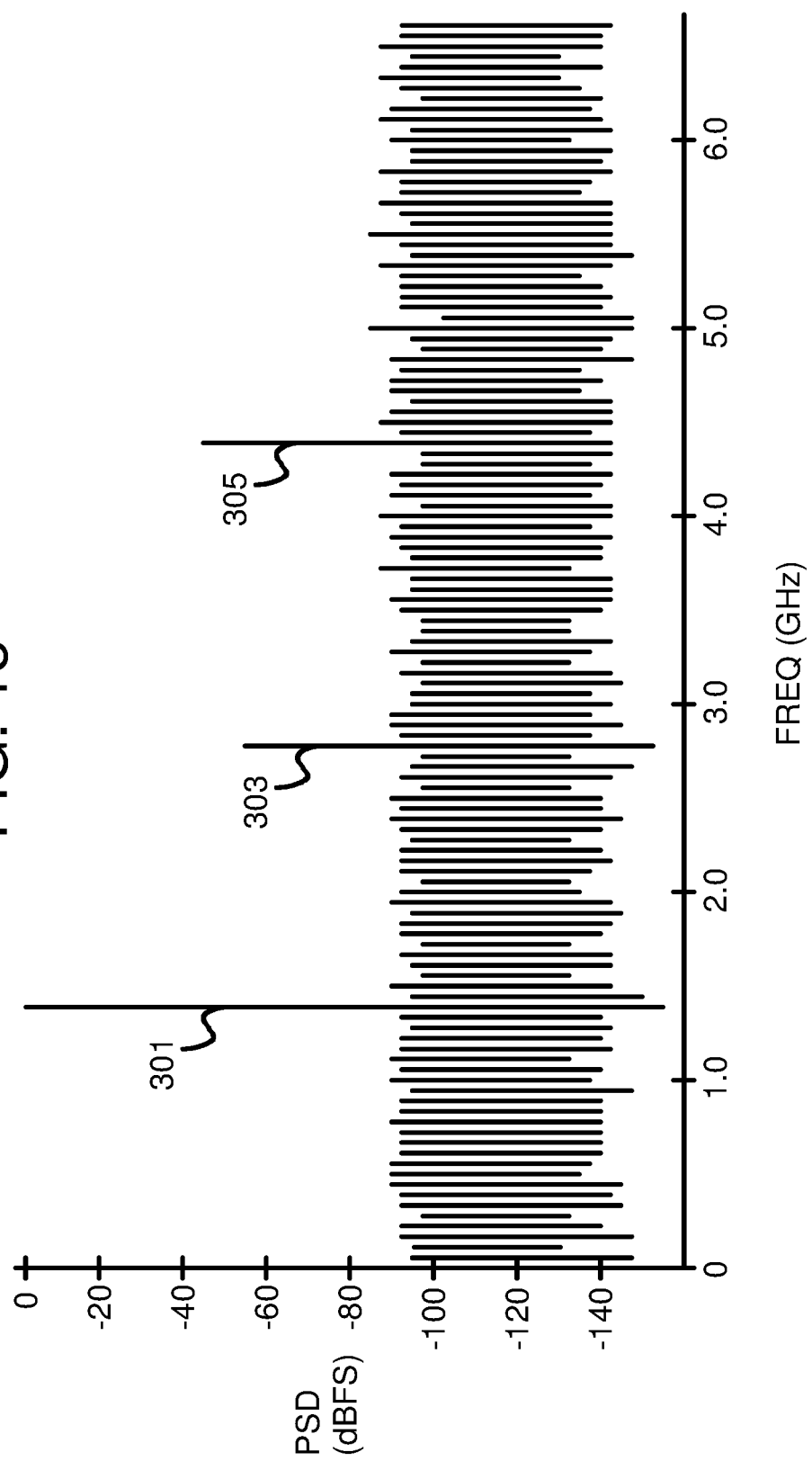

ANALOG-TO-DIGITAL CONVERTER (ADC) WITH REFERENCE ADC PATH RECEIVING ATTENUATED INPUT TO GENERATE ERROR CODES FOR SECOND AND THIRD HARMONICS BY COUNTING NEGATIVE AND POSITIVE CODES

FIELD OF THE INVENTION

This invention relates to Analog-to-Digital Converters (ADC), and more particularly to digital error correction by counting digital codes to remove second and third harmonic distortion (HD2, HD3) errors.

BACKGROUND OF THE INVENTION

Analog-to-Digital Converters (ADCs) are widely used to convert analog signals to digital values. Multi-bit ADCs have a high resolution, and its accuracy can be improved by calibration. Higher sampling rates can be achieved by interleaving two ADCs that each operate at half of the sampling rate.

FIG. 1 shows a prior-art interleaved ADC. ADC 110 and ADC 112 are interleaved, with ADC 110 sampling analog input AIN when clock CLK closes switch 20, and ADC 112 sampling analog input AIN when inverse clock CLKB closes switch 22. Mux 18 selects digital output Y1 from ADC 110 when CLK is high, when ADC 110 has had sufficient time to sample and hold AIN and convert it to a digital value. The digital output DOUT is Y2 when CLK is low to mux 18. Thus, each of ADC 110, 112 can operate at half the data rate of the final output DOUT.

FIG. 2 is a graph of analog sampling and clock skew. AIN is sampled into ADC 110 to generate Y1 [K−1] and Y1 [K] on the falling edges of CLK, while AIN is sampled into ADC 112 to generate Y2 [K−1] and Y2 [K] on the falling edges of CLKB, where K is the sample or time-index number. The sampling time or period of AIN is Ts. Ideally there is no clock skew in CLK, and all samples are separated by Ts. However, CLK may not have a pulse width that is exactly 50% of period 2*Ts, introducing sampling pulse-width mismatch and non-linearities. Sampling of channel Y2 may be delayed relative to sampling of channel Y1 by Ts+ΔT/2, while Sampling of channel Y1 may be delayed relative to sampling of channel Y2 by Ts−ΔT/2. Ideally ΔT=0 without mismatch on sampling. However, in reality ΔT is finite. It is desired to reduce ΔT to a minimal acceptable level for more than 2 channels.

ADC 110, 112 and switches 20, 22 may not be exactly matched, introducing finite bandwidth mismatches among the two channels Y1, Y2. Thus, both sampling-pulse mismatches and ADC component mismatches may contribute to nonlinearities.

Multiple ADC channels may be provided in parallel and time-interleaved to increase speed and precision of an ADC. FIG. 3 shows clocks that sample interleaved ADC channels. For a simplified 4-channel interleaved ADC, sampling clocks TS1, TS2, TS3, TS4 are non-overlapping, allowing each of the four channels to be sampled at a separate time slot.

FIG. 4 is a block diagram of a 4-channel interleaved ADC with product derivative correlators and a matrix processor for calibration of programmable input delays. Analog input AIN is buffered by analog buffer 30 and sampled by switches 21, 22, 23, 24 into ADC 111, 112, 113, 114 that generate digital values D1, D2, D3, D4, respectively. Mux 64 alternately selects D1, D2, D3, D4 to generate the final data output DOUT. Final mux 64 operates with clock CK that has four times the frequency of sampling clock TS1.

Sampling clocks TS1, TS2, TS3, TS4 can be a four-phase clock all operating at the same frequency but with phase shifts of 0, 90, 180, and 270 degrees. Sampling clocks TS1, TS2, TS3, TS4 are delayed by variable delays to generate clocks T1, T2, T3, T4 that control switches 21, 22, 23, 24, respectively, that sample AIN to ADC 111, 112, 113, 114 that generate channel digital outputs D1, D2, D3, D4, having phases of 0, 90, 180, and 270 degrees. These variable delays are programmed during calibration with digital values that are stored in a Successive-Approximation-Register (SAR) that enable and disable binary-weighted capacitor delay elements. Calibration uses a Successive-Approximation method testing larger, Most-Significant Bit (MSB) capacitors first, then testing successively smaller capacitors until a Least-Significant Bit (LSB) capacitor is tested.

SAR programmable delay 41 delays sampling clock TS1 to generate T1 to switch 21, while SAR programmable delays 42, 43, 44 delay sampling clocks TS2, TS3, TS4 to generate T2, T3, T4 to switches 22, 23, 24, respectively. By adjusting the delay values programmed into SAR programmable delays 41, 42, 43, 44, the timing skews between channels D1, D2, D3, D4 can be compensated for and matched to within the delay of 1 LSB capacitor in SAR programmable delay 41, 42, 43, 44.

Finite-Impulse-Response (FIR) filters 97 filter digital outputs D1, D2, D3, D4 from ADC 111, 112, 113, 114 to generate filtered digital values Y1, Y2, Y3, Y4. FIR filters 97 can act as lowpass, bandpass, or all-pass filters for calibration.

Product derivative correlators 52 receive filtered digital values Y1, Y2, Y3, Y4 and generate product derivative factors F1, F2, F3, F4. The product derivative factor F2 is a function of the current channel filtered digital value Y2, and the adjacent channels Y1, Y3. In general, the product derivative factor F(X) for a channel X has inputs Y(X), Y(X−1), and Y(X+1), where X−1 and X+1 are modulo N, where N is the number of interleaved channels. Each product derivative correlator 52 generates a correlation factor of the current channel compared to the two adjacent channels. Product derivative correlator 52 can be a mid-point correlator.

Matrix processor 50 receives product derivative factors F1, F2, F3, F4 from product derivative correlators 52, and forms a matrix from F1, F2, F3, F4 that is multiplied by a correlation matrix to generate sign bits. The correlation matrix is constant matrix that is fixed for a fixed number of channels N.

During calibration, the delay in SAR programmable delay 41 is fixed and acts as a timing reference for the other N−1 channels. Therefore, the sign bit for channel 1 is not generated by matrix processor 50.

For a constant or slow-moving analog input AIN, all channels should generate the same filtered digital values Y1, Y2, Y3, Y4. Differences in these values among channels can indicate skews or timing differences.

Product derivative factors F1, F2, F3, F4 each indicate a digital value or timing difference between a channel and its two adjacent channels. These timing differences are combined with all other timing differences by matrix processor 50 to generate the sign bits. The sign bits indicate which channels have larger delays, and which channels have smaller delays.

Calibrator 55 uses these sign bits during a successive-approximation sequence to decide when to keep a test bit set in SAR programmable delay 42, 43, 44 and when to reset the test bit, as successively smaller bit-positions are tested.

Applicant's earlier application, U.S. Ser. No. 17/537,460, now U.S. Pat. No. 11,641,210, describes the operation of matrix processor 50 and product derivative correlators 52 in more detail, which form channel correlator 500. Another embodiment of channel correlator 500 uses a binary tree of auto-correlators, and is described in another related application, U.S. Ser. No. 17/455,471, now U.S. Pat. No. 11,632,121.

While Applicant's prior inventions have remarkably reduced offset, gain, and timing-skew mismatch errors, some errors may still remain. For example, input buffer 30 and sample switches 21, 22, 23, 24 may suffer from non-linearity. These nonlinearities may cause second and third harmonic distortion, referred to as HD2 and HD3. This HD2 and HD3 noise may fundamentally limit the achievable dynamic range of the ADC. High speed high resolution ADCs, such as a 10 GS/s 12b ADC, are particularly limited by HD2, HD3. Increasing the size and currents in the input buffer and switches can help, but high currents are not desired for low-power applications. Detection and correction of these analog input buffer and switching nonlinearities in the digital domain is more desirable.

HD2 and HD3 and other harmonic related tones may depend on the input signal profile and vary over time. Digital calibration loops may not converge for some of the possible input signal profiles. However, such digital calibration to remove HD2 and HD3 errors may require least-squares or polynomial fitting algorithms with a high computational load. Many samples of the ADC digital outputs may need to be stored in a large memory to perform this polynomial regression or other mathematical functions. Some prior-art digital processing may only be able to correct even harmonics or odd harmonics, but not bother even and odd harmonics, and thus cannot remove both HD2 and HD3 errors.

What is desired is digital-domain detection and correction of these remaining HD2 and HD3 errors caused by nonlinearities in analog sampling of ADC channels in a highly-interleaved ADC. These second-harmonic HD2 and third-harmonic HD3 errors may remain after a variable, programmable delay is set for each of the channel inputs to correct for timing skews caused by sampling pulse-width, clock, and component mismatches among the 3 or more channels interleaved together. It is desired to detect and remove both HD2 and HD3 errors that remain after such dynamic calibration without requiring a large memory to store a large number of samples for digital processing.

BRIEF DESCRIPTION OF THE DRAWINGS

FIGS. 12A-12C are graphs of the polynomial function A and correlation function C for linear and nonlinear outputs highlighting code polarity counting for odd harmonics.

FIG. 15 is a graph of spurious tones in a spectrum for an interleaved ADC with nonlinear errors.

DETAILED DESCRIPTION

The present invention relates to an improvement in digital removal of nonlinearity errors in a calibrated interleaved ADC. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described but is to be accorded the widest scope consistent with the principles and novel features herein disclosed.

Figure 1:
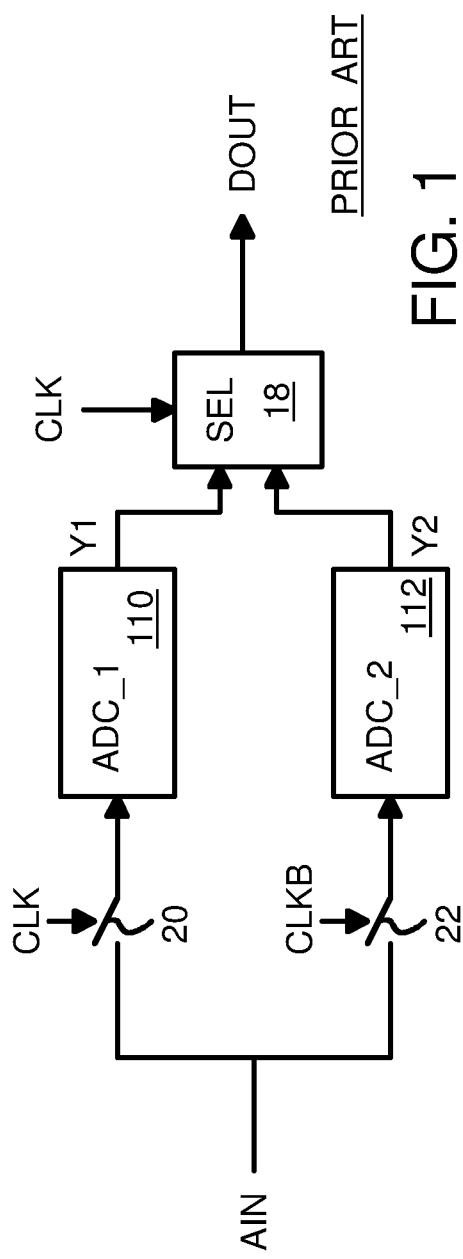
FIG. 1 shows a prior-art interleaved ADC.
Figure 2:
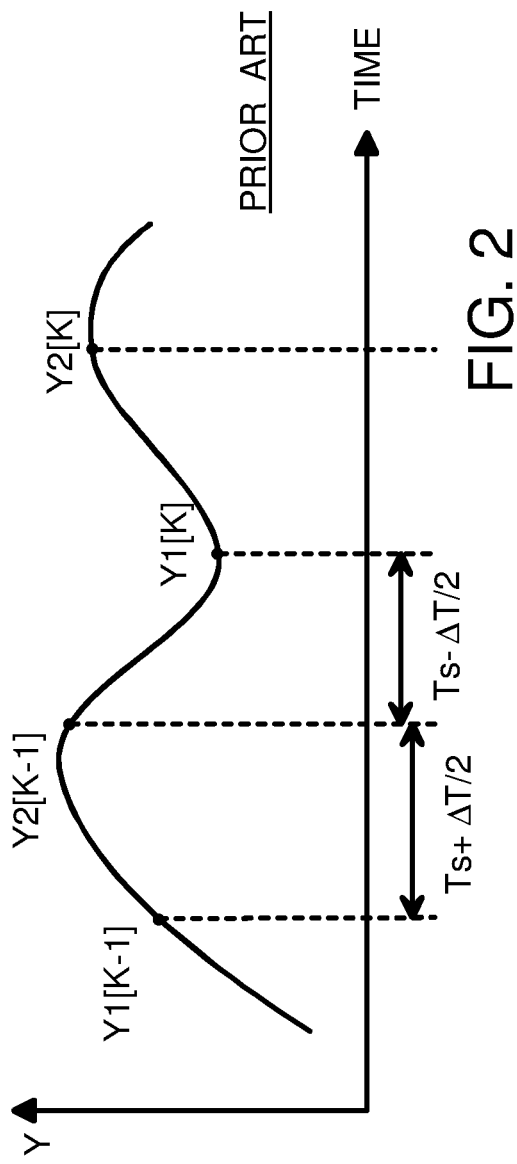
FIG. 2 is a graph of analog sampling and clock skew.
Figure 3:
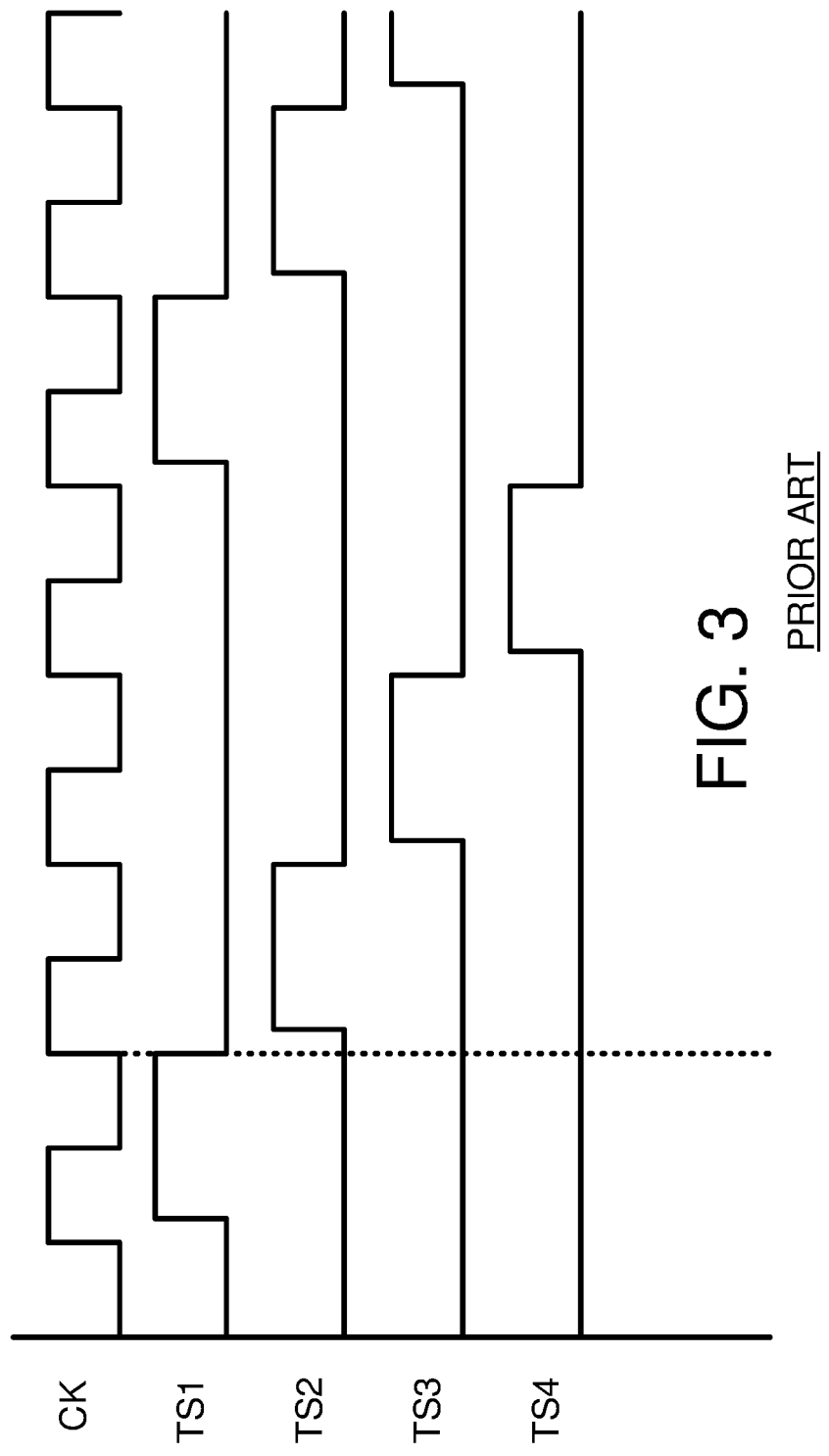
FIG. 3 shows clocks that sample interleaved ADC channels.
Figure 4:
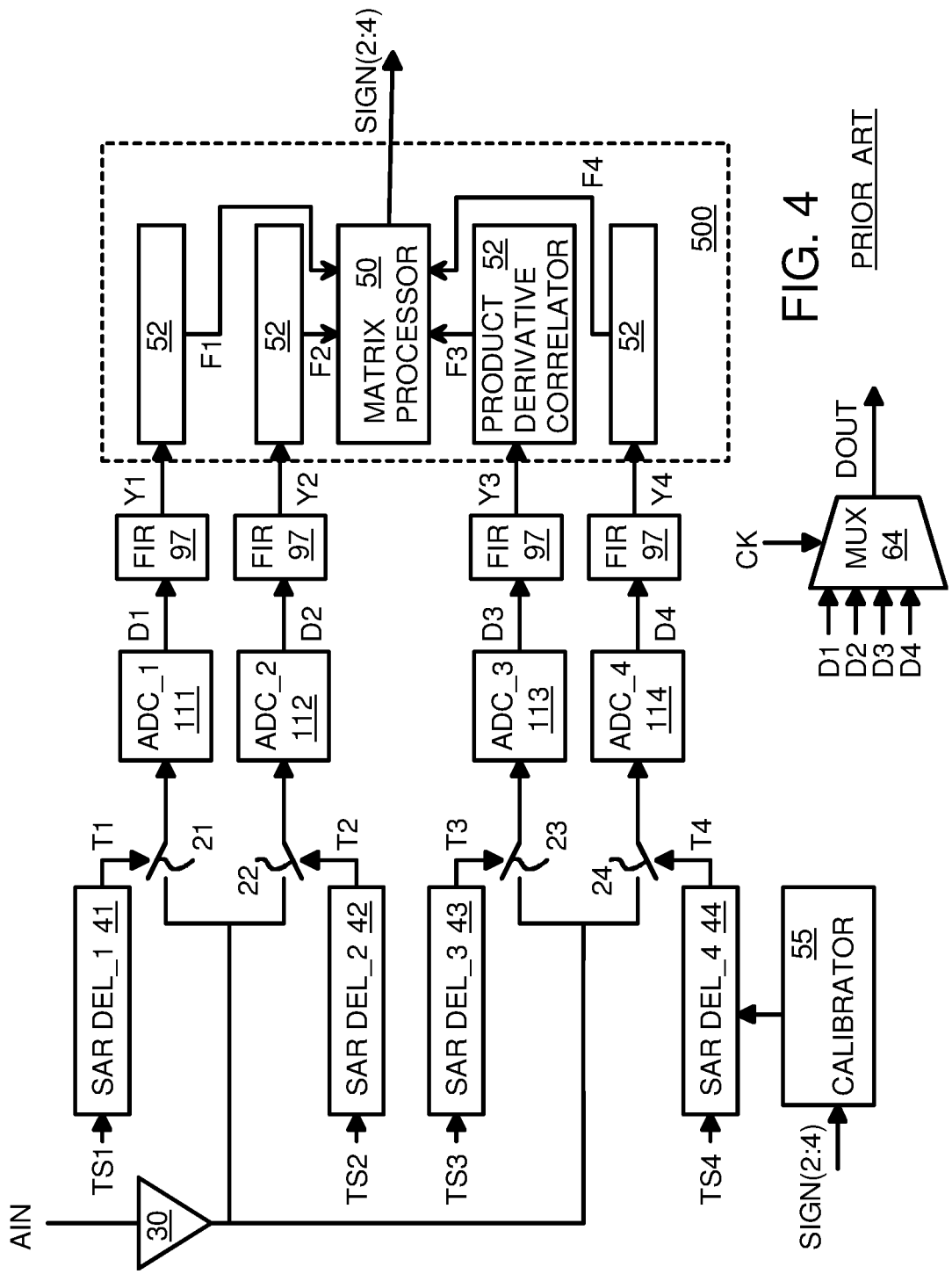
FIG. 4 is a block diagram of a 4-channel interleaved ADC with product derivative correlators and a matrix processor for calibration of programmable input delays.
Figure 5:
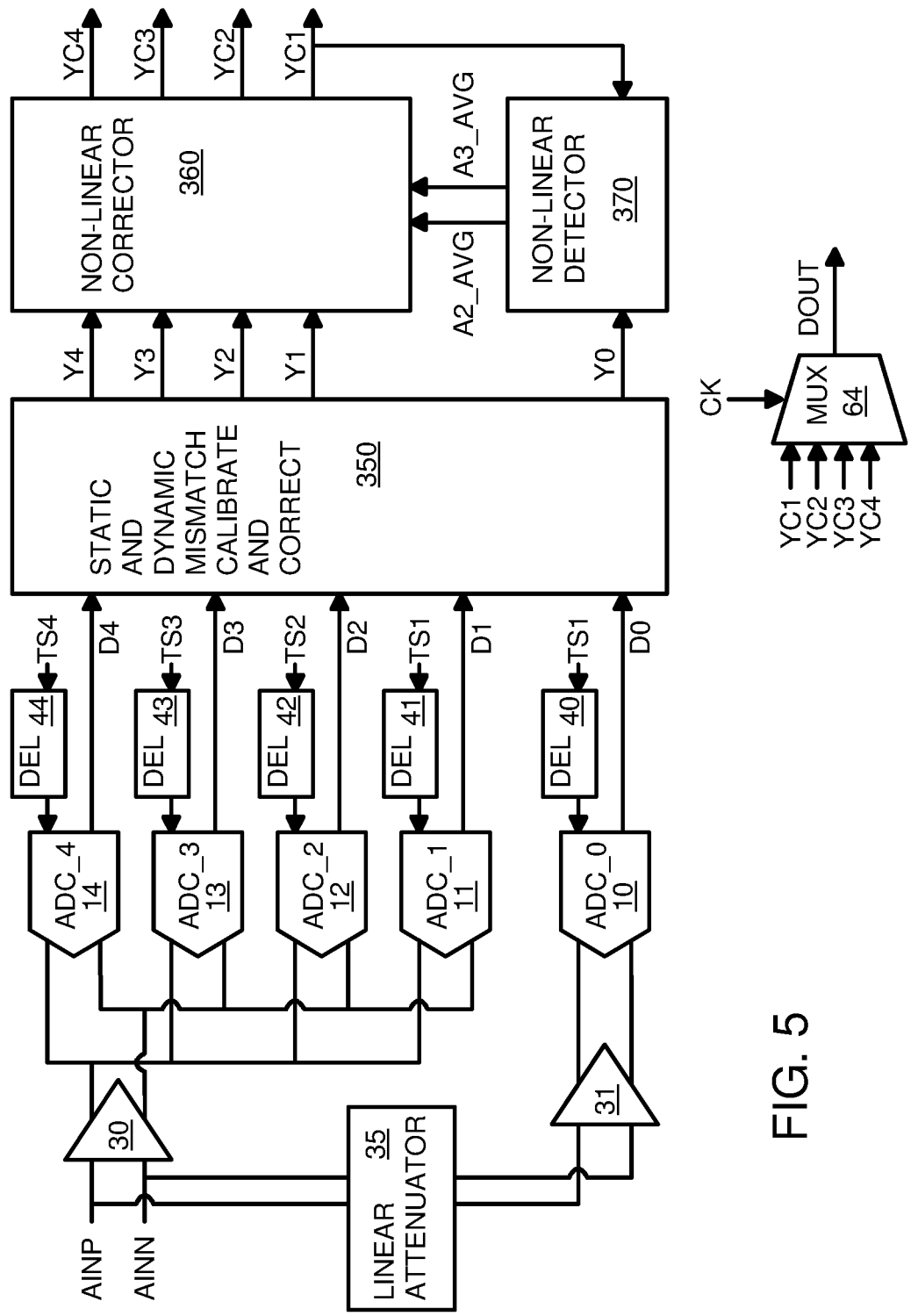
FIG. 5 is a block diagram of a 4-channel interleaved ADC with an extra reference ADC channel having an attenuated input.

FIG. 5 is a block diagram of a 4-channel interleaved ADC with an extra reference ADC channel having an attenuated input. A differential analog front-end is shown. Switches 21-24 and ADC 111-114 of FIG. 4 are replaced by ADC 11-14 in FIG. 5. Clocks TS1-TS4 (FIG. 3) are delayed by programmable delays 40-44 to drive the analog sampling switches, similar to switches 21-24 but differential, inside ADC 10-14.

Analog input AINP, AINN is a differential analog input signal that is buffered by input buffer 30 and sampled by analog switches in ADC 11, 12, 13, 14. These analog switches are clocked by interleaved clocks TS1, TS2, TS3, TS4 that are delayed by programmable delays 41, 42, 43, 44, respectively.

An additional ADC 10 samples analog inputs AINP, AINN after attenuation by linear attenuator 35 and buffering by input buffer 31. Linear attenuator 35 can be simple passive resistor or capacitor voltage divider that is still highly linear. Input buffer 31 can be identical to input buffer 30 to prevent introducing any mismatches. Likewise, each of ADC 10, 11, 12, 13, 14 can be identical to prevent mismatches.

The same clock TS1 drives both ADC_0 and ADC_1, but a different programmable delay can be programmed into delay 40, 41 if any skews or mismatches are detected during calibration. The reference channel with ADC 10 can be a replica of the first channel with ADC 11, corrected for any timing skews or mismatches detected during calibration.

Since the input to ADC 10 is attenuated by linear attenuator 35, any second harmonic (HD2) or third harmonic (HD3) errors are significantly reduced in ADC 10 compared with those errors in ADC 11. For example, a 3× attenuation by linear attenuator 35 can provide a 20 dB improvement in Total Harmonic Distortion (THD).

Thus the reference channel (ADC 10) is a linear copy of the first channel (ADC 11) but with nearly harmonic-free data for use in digital calibration. Distortion caused by the analog input buffers and sampling switches is very dependent on the input signal profile. Higher frequency and higher signal swing will create larger HD2, HD3. Linear attenuator 35 significantly reduces HD2, HD3 in the reference channel ADC_0, allowing for better detection and correction of second and third harmonic errors.

Figure 6:
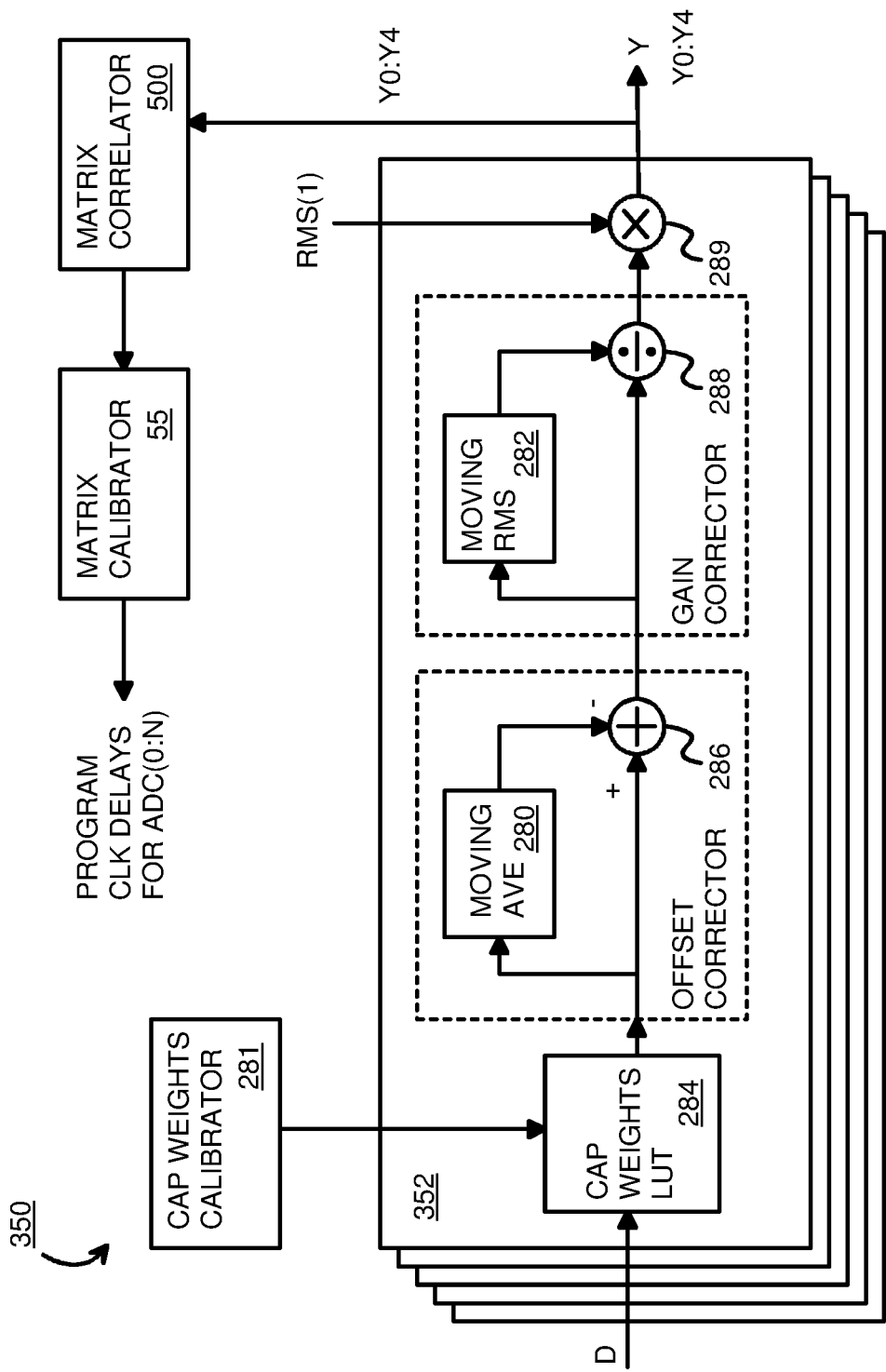
FIG. 6 is a diagram of the static and dynamic calibrator.

Capacitor mismatch, static offset, gain mismatch, and timing skew or finite bandwidth mismatches are detected and removed by static and dynamic calibrator 350 (details shown and described for FIG. 6). The digital outputs D0, D1, D2, D3, D4 for all channels, including the reference channel, are calibrated and corrected by static and dynamic calibrator 350 to generate outputs Y0, Y1, Y2, Y3, Y4.

Then only the actual data Y1, Y2, Y3, Y4 are digitally corrected for non-linear errors by nonlinear corrector 360. Reference data Y0 is not corrected, but is compared to corrected first channel data YC1 by nonlinear detector 370 to generate coefficients a2_avg and a3_avg. These coefficients a2_avg and a3_avg are applied to all four data channels of nonlinear corrector 360 to generate corrected outputs YC1, YC2, YC3, YC4. Then mux 64 alternately selects one of YC1, YC2, YC3, YC4 for each clock CK for output as the final output data DOUT.

Thus channels 1 to 4 carry the actual interleaved data, while reference channel 0 is used as a highly linear reference Y0 for comparison to first channel Y1 by nonlinear detector 370.

FIG. 6 is a diagram of the static and dynamic calibrator. A variety of first-order error correction is performed by static and dynamic calibrator 350 to correct the raw data D0:D4 from ADC 10-14 to generate intermediate data Y0:Y4.

For example, the capacitors in the capacitor arrays in ADC 10-14 may not be their exact design sizes due to manufacturing variations. Capacitor weights calibrator 281 performs a routine to test each capacitor relative to other capacitors to determine each capacitor's relative weight. These weights are stored in capacitor weight Look-Up Table (LUT) 284. The weights read from LUT 284 are summed for all active (=1) bits in D to get the digital equivalent. See for example U.S. Pat. No. 10,483,995.

Offset and gain mismatches can be corrected for by subtracting an average over M samples for each ADC channel. ADC 11 generates digital output D1 that has offset and gain mismatches. A moving average of D1 is generated by moving averager 280 over M samples, and this moving average is subtracted by subtractor 286 from D1. Thus a time-varying offset error can be detected and removed.

A moving Root-Mean-Square (RMS) of D1 is generated over M samples by moving RMS generator 282, and the offset-corrected digital output D1 is divided by this moving rms value by divider 288 and multiplied by channel 1's RMS1 by multiplier 289 to generate normalized digital output Y1 for channel 1. Each channel is separately corrected for offset and gain and multiplied by RMS1 in a similar manner. These are updated after every M samples. Thus a time-varying RMS error can be detected and corrected for.

Timing skew and finite bandwidth errors among the ADC channels may exist. These are dynamic errors since they can depend on the input signal profile (slew rate, amplitude, frequency). Another calibration routine is performed to remove these errors by programming variable delays into SAR programmable delays 40, 41, 42, 43, 44 to adjust the clock skews of the ADC analog sampling clocks.

Channel correlator 500 correlates channel outputs Y0:Y5 using matrix processor 50 and product derivative correlators 52 (FIG. 4) to generate a vector of sign bits. Calibrator 55 uses these sign bits during a Successive-Approximation (SA) sequence during calibration to decide when to keep a test bit set in SAR programmable delay 40, 42, 43, 44 and when to reset the test bit, as successively smaller bit-positions are tested. Programmable delay 41 for channel 1 can be set to its midpoint value as a fixed reference while other channels' programmable delays 40, 42, 43, 44 are adjusted by the SA routine performed by calibrator 55.

Applicant's related application, U.S. Ser. No. 17/537,460, now U.S. Pat. No. 11,641,210, describes in detail the operation of calibrator 55, and the operation of matrix processor 50 and product derivative correlators 52 (FIG. 4), which form channel correlator 500. The reference channel of ADC_0 10 can be input to channel correlator 500 as an additional channel, so the example of 4 data channels can be expanded to 5 channels that are correlated by channel correlator 500. In general, channel correlator 500 has N+1 channel inputs for N data channels that are interleaved together because the additional reference channel is also correlated for dynamic calibration of the reference channel's actual mismatches.

Figure 7:
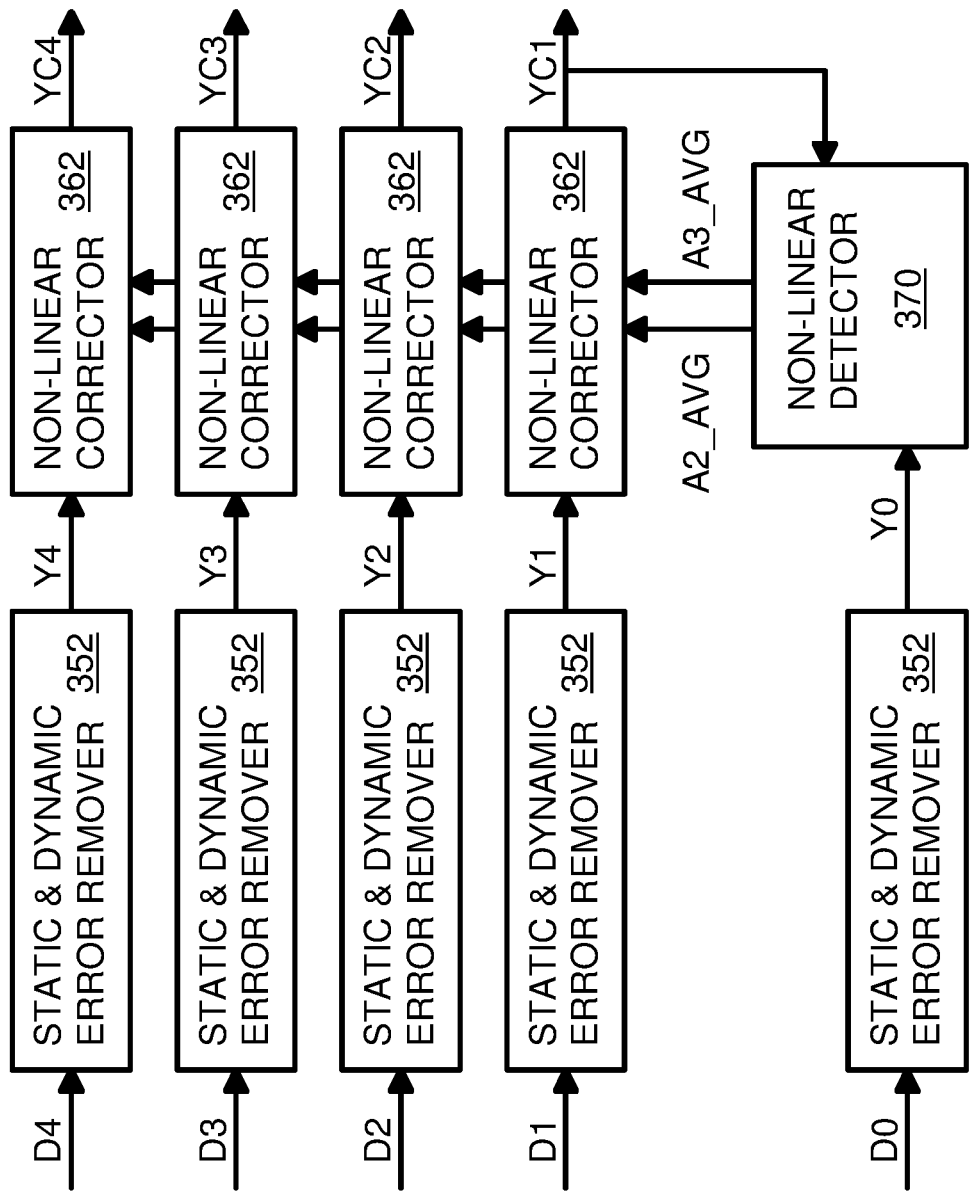
FIG. 7 shows digital domain error processing for interleaved and reference channels.

FIG. 7 shows digital domain error processing for interleaved and reference channels. Digital data D0, D1. D2, D3, D4 from ADC 10, 11, 12, 13, 14 for both the four interleaved data channels and the reference channel are input to static and dynamic calibrator 350. Each channel has static and dynamic remover 352 which operates to remove mismatches on that channel. Each static and dynamic remover 352 is a slice of static and dynamic calibrator 350 for one ADC channel.

Each static and dynamic remover 352 has capacitor weight Look-Up Table (LUT) 284, moving averager 280, moving RMS generator 282, and other components shown in FIG. 6 that operate to remove capacitor mismatches, offset error, and gain error. These are considered static errors.

Once these static errors are removed, dynamic errors may still exist. These dynamic errors include channel-to-channel mismatches, timing skews, and finite bandwidth mismatch errors. These are considered dynamic errors since they depend on the input signal profile (frequency, slew, amplitude). Such dynamic errors are removed by adjusting the analog sampling clock pulses, which are controlled by SAR programmable delays 40, 41, 42, 43, 44. Channel correlator 500 examines output Y for all channels including reference channel Y0, correlates these channels to all other channels using a matrix processor, and then calibrator 55 performs a SA routine to repeatedly adjust these programmable delays to reduce these dynamic errors. This dynamic calibration can be performed at initialization, in the background, or during normal operation as conditions change.

Thus the digital output Y of each static and dynamic remover 352 has been corrected for static and dynamic errors. Although digital output Y is much better than ADC output D, nonlinear errors may still remain in Y. These errors can limit the operation of a very high speed and high resolution ADC, such as a 10 GS/s, 12b ADC.

These non-linear errors are detected by nonlinear detector 370 and then removed by nonlinear channel corrector 362. Each nonlinear channel corrector 362 is a slice of nonlinear corrector 360 for one channel, removing the detected non-linear errors from digital data Y to generated corrected data YC, which can be muxed to drive the final data output for the interleaved ADC.

Only the four data channels Y0 to Y4 are applied to nonlinear channel corrector 362 and corrected using coefficients a2_avg and a3_avg. Reference channel output Y0 is not corrected by nonlinear channel corrector 362. Instead nonlinear detector 370 receives both Y0 and YC1 for the reference channel and corrected data channel 1 and generates the HD2 and HD3 error correction coefficients a2_avg and a3_avg.

The reference path 0 of ADC 10 faithfully duplicates the path of first ADC 11, including static and dynamic remover 352, to generate Y0 that is a faithful replica of data Y1 from data channel 1. However, since the reference path includes linear attenuator 35, code Y0 from the reference channel will be smaller than code Y1 from channel 1. The smaller signal due to linear attenuator 35 will result in less distortion and more linearity. Thus reference code Y0 will be a highly linear copy of Y1.

Since a 3× attenuation by linear attenuator 35 can result in a 20 dB improvement in THD, reference code Y0 can be considered to be a fully linear reference code that has negligible nonlinear errors. The attenuation has reduced nonlinear errors in code Y0 to be negligible and thus assumed to be zero. Therefore reference code Y0 can be considered to be a replica of code Y1 with the nonlinear errors removed.

The small-signal output of the ADC, referred back to the analog input, can be approximated as a polynomial function A:

$$A = a_0 + a_1 \cdot x + a_2 \cdot x^2 + a_3 \cdot x^3 + \ldots$$

where $a_0$ is the offset error, $a_1$ is the gain error term, $a_2$ is the second harmonic term (second coefficient), and $a_3$ is the third harmonic term. These can also be considered to be the zero-order, first, second, and third-order coefficients.

For practical ADC's, coefficients above three are so small that they can be ignored. Since the reference path is an exact replica of the first ADC path, and their offsets and gain error have been removed by static and dynamic remover 352, the offset is zero, $a_0=0$, and $a_1$ can be treated as=1 since Y0 is linear with Y1 and would have the same gain coefficient.

Since all data channels have been matched to remove static and dynamic errors, all four data channels will have very similar coefficients $a_2$ for HD2 and $a_3$ for HD3 errors. Thus the coefficients $a_2$ and $a_3$ calculated for channel 1 can be used for all other channels 2, 3, 4. One set of $a_2$, $a_3$ coefficients can be used.

Thus polynomial function A is reduced to:

$$A = x + a_2 \cdot x^2 + a_3 \cdot x^3$$

Figure 8:
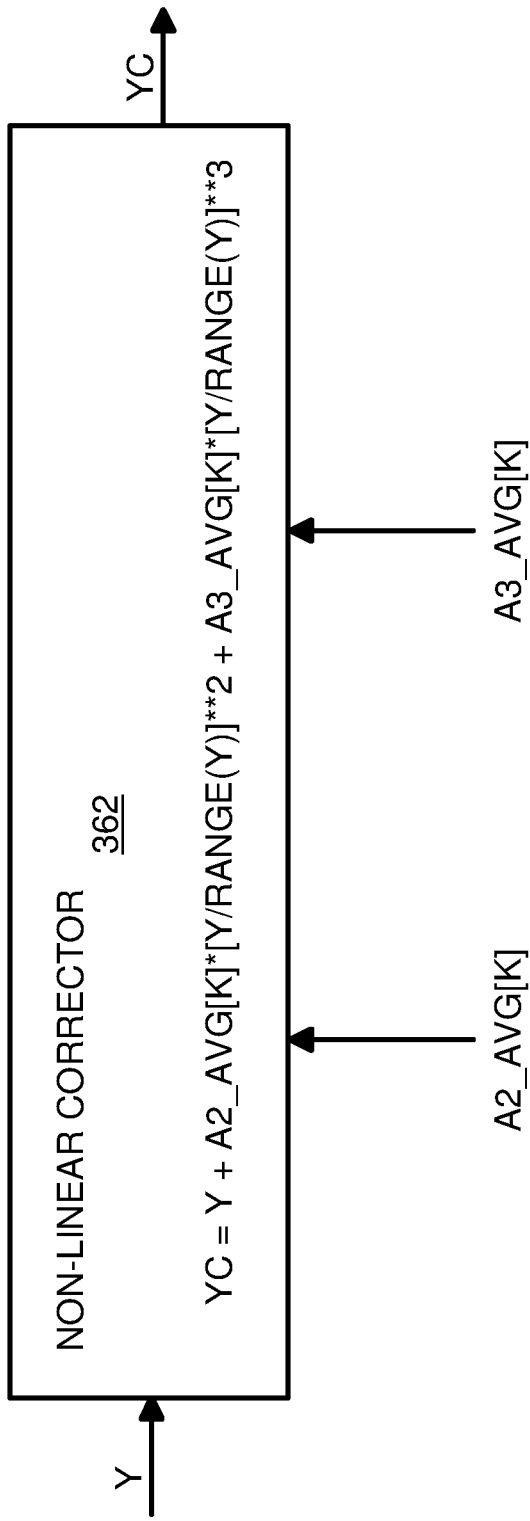
FIG. 8 shows the nonlinear channel corrector that corrects HD2 and HD3 errors using averaged coefficients generated by the nonlinear detector.

FIG. 8 shows the nonlinear channel corrector that corrects HD2 and HD3 errors using averaged coefficients generated by nonlinear detector 370. Each of the data channels has one nonlinear channel corrector 362 that generates a corrected output code YC ($Y_{cor}$) from code Y output from static and dynamic calibrator 350 for that channel. For example, nonlinear channel corrector 362 generates YC1 from Y1 for channel 1, and another nonlinear channel corrector 362 generates corrected code YC4 from Y4.

Reference channel code Y0 is not corrected since linear attenuator 35 significantly reduces any HD2 and HD3 errors in the reference channel. Therefore Y0 is assumed to be free of HD2 and HD3 errors. No nonlinear channel corrector 362 is needed for reference channel 0.

For each data channel, corrected code YC is corrected for second harmonic (HD2) and third harmonic (HD3) errors by nonlinear channel corrector 362, which performs the following calculation:

$$Y_{cor} = Y + a_{2\_avg} \cdot \left(\frac{Y}{\text{range}(Y)}\right)^2 + a_{3\_avg} \cdot \left(\frac{Y}{\text{range}(Y)}\right)^3$$

For a 12b ADC, range (Y) is 4096 (−2048 to +2047). The averaged second-order correction coefficient a2_avg ($a_{2avg}$) is multiplied by the square of the normalized Y code, while the averaged third-order correction coefficient a3_avg ($a_{3avg}$) is multiplied by the cube of the normalized Y code.

Since HD2 errors are removed (subtracted) by the second term in the YC equation above, and HD3 errors are removed by the third term, a2_avg and a3_avg are defined to have the opposite signs of a2, a3 in the polynomial function A (above).

Since HD3 errors tend to be smaller than HD2 errors, nonlinear detector 370 can first set a3_avg to zero and focus on adjusting a2_avg to minimize the HD2 error. Then once a stable value of a2_avg is found, nonlinear detector 370 can keep using this stable value of a2_avg and adjust a3_avg until the HD3 error is also removed to a desired degree. Alternately, nonlinear detector 370 can adjust both a2_avg and a3_avg at the same time.

Figure 9:
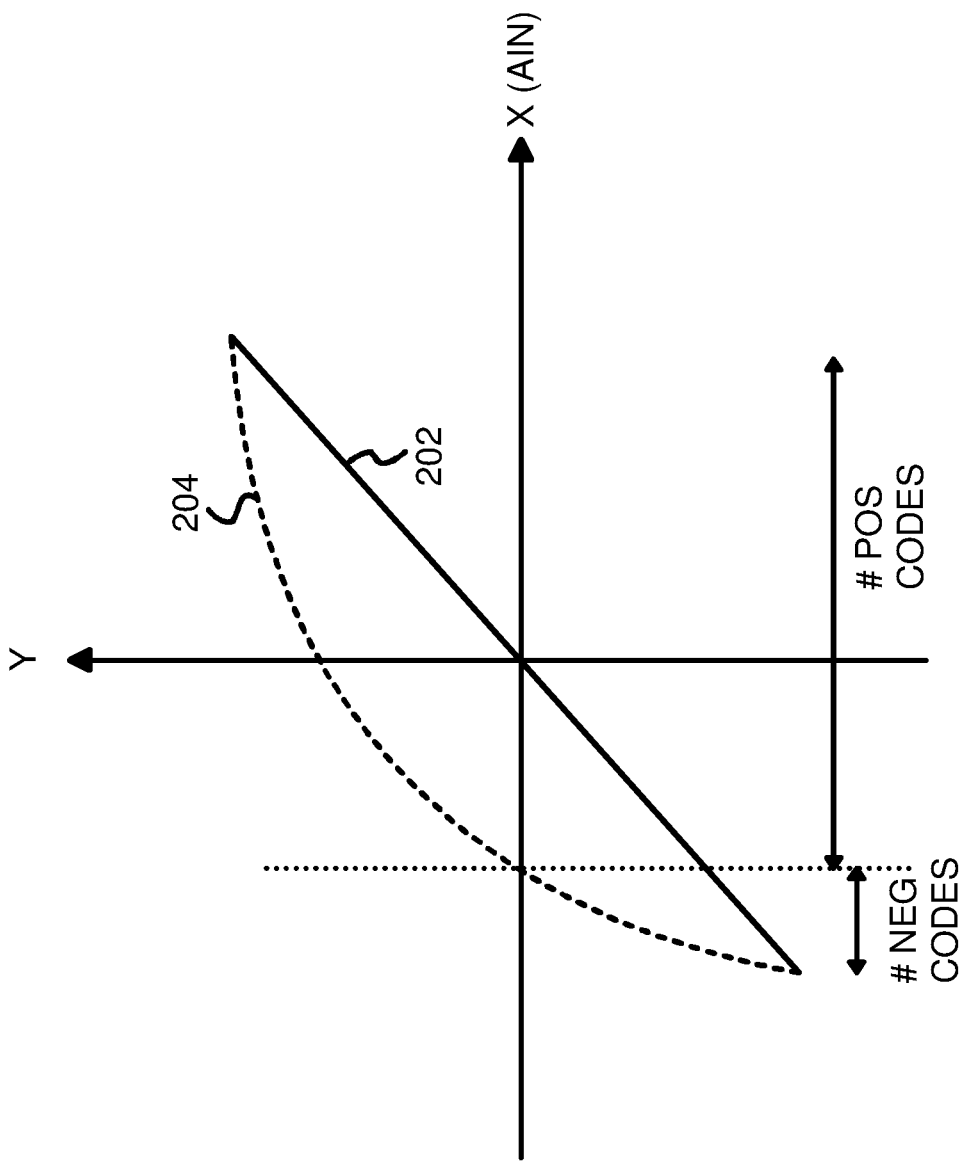
FIG. 9 is a graph of the polynomial function A for linear and nonlinear outputs highlighting code polarity counting.

FIG. 9 is a graph of the polynomial function A for linear and nonlinear outputs highlighting code polarity counting. Polynomial function A is a function of x over a range, such as −2048 to +2047 for x, or $-V_{REF}/2$ to $V_{REF}/2$ for AIN. In real systems, the distortion from the second harmonic HD2 can be much larger than distortion from the third harmonic HD3, but not always.

When HD3 errors are ignored, polynomial function A when representing data Y after static and dynamic remover 352 can be represented as:

$$A = x + a_2 \cdot x^2$$

When negligible HD2 or HD3 errors exist, such as for reference channel Y0, A is a linear function of x, as shown by ideal line 202 which has no nonlinear errors. However, when HD2 errors are present, such as for Y1 from data channel 1, then curve 204 represents Y1, when $a_2$ is positive. When $a_2$ is negative, then curve 204 would be below line 202 with a similar shape. Since x is squared, the sign of x does not affect curve 204.

For the most negative values of analog input AIN, or x, on the left of the y-axis, curve 204 will be below the x-axis, meaning that Y is negative. For larger values of AIN and x, to the right of the dotted vertical line, curve 204 is above the x-axis, and Y is positive.

When a small signal is applied to the analog input, and this small signal swings across a wide range of x, the Y codes to the left of the vertical dotted line will be negative Y codes, and the Y codes to the right of the vertical dotted line will be positive Y codes.

The ratio of the number of negative Y codes to the number of positive Y codes is an indication of how far curve 204 is from ideal line 202. Thus this ratio can serve as a cost function when adjusting nonlinear corrector 360 to compensate for HD2 errors. A difference of the number of negative Y codes and the number of positive Y codes could also be used rather than a ratio.

The inventor observes Y over a range of M values that includes at least one small-signal cycle over a wide range of x values. The sign bit of Y is used to increment a counter of negative Y values. The ratio of neg_Y_count/M, or a difference (neg_Y_count−pos_Y_count), or similar measures, can be used as a cost function. The cost function then adjusts coefficient $a_2$ to nonlinear channel corrector 362, and the cost function is recalculated over another M samples to further correct $a_2$ until the HD2 error is adequately compensated for.

As $a_2$ is adjusted, curve 204 should flatten and become closer to ideal line 202. If $a_2$ overcompensates HD2 correction and curve 204 is below line 202, then the sign of $a_2$ will invert. Over time $a_2$ will approach a stable value that minimizes the remaining HD2 error. Ideal line 202 has an equal number of positive and negative codes, so the difference in the numbers of negative and positive Y codes can serve as a cost function to be minimized.

Figure 10:
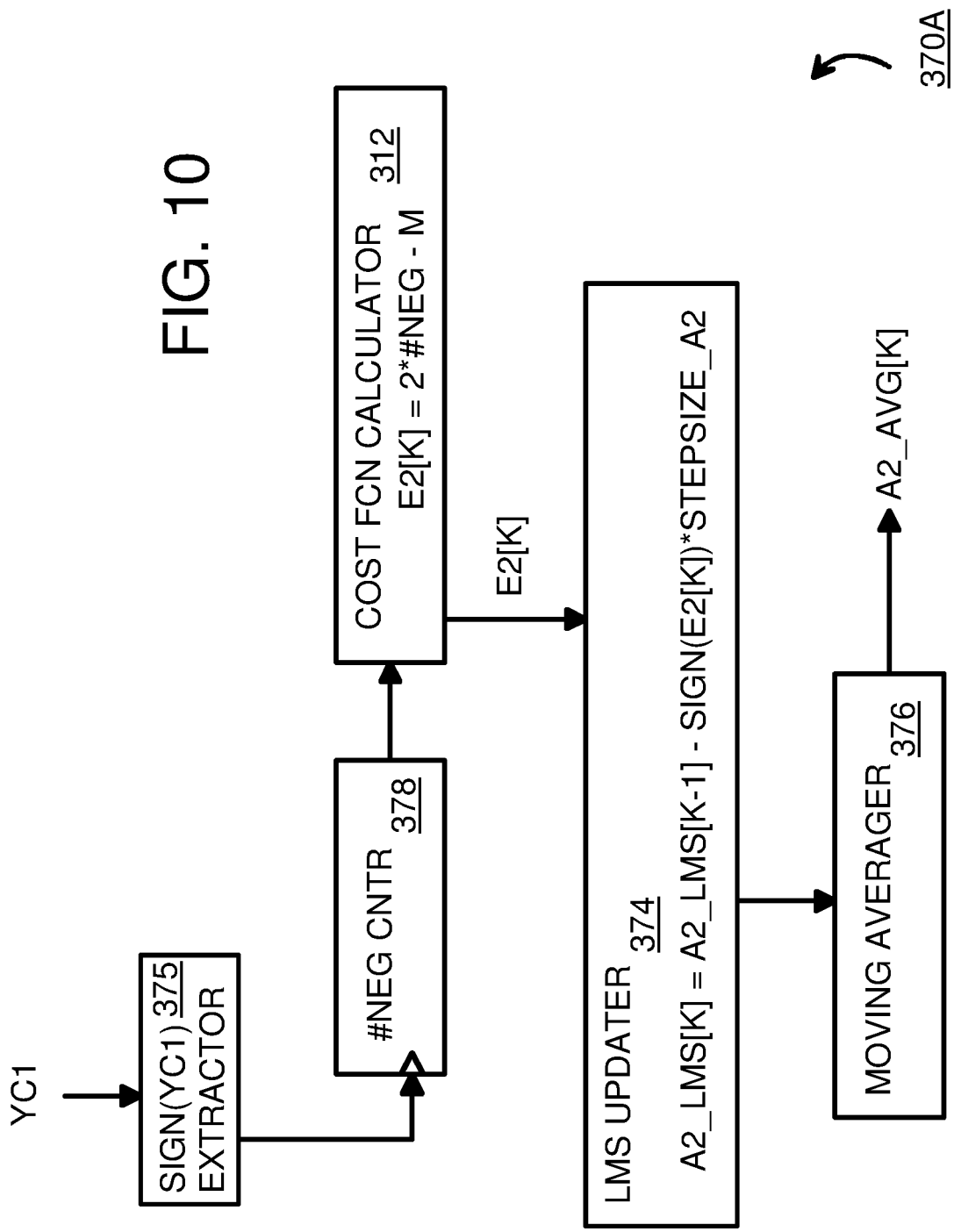
FIG. 10 is a diagram of the nonlinear detector for HD2 errors.

FIG. 10 is a diagram of the nonlinear detector for HD2 errors. Nonlinear detector 370 includes nonlinear detector 370A for detecting second harmonic HD2 errors and nonlinear detector 370B (FIG. 13) that detects third harmonic HD3 errors.

A time-varying input is applied to the analog input AINP, AINN, and static and dynamic remover 352 removes static and dynamic errors to generate Y1 for channel 1. The nonlinear errors predicted by a2_avg are removed from Y1 using nonlinear channel corrector 362 to generate corrected YC1 output by nonlinear channel corrector 362.

Sign extractor 375 extracts the sign from each sample of YC1, such as the leading bit being 1 for negative and 0 for positive for two's complement formats. When the sign is 1, negative code counter 378 is incremented. After M samples, counter 378 contains the number of negative YC codes before counter 378 is reset for the next group of M samples.

Cost function calculator 312 generates the cost function e2[k] by doubling the negative code count from counter 378 and subtracting the total number of samples M. Cost function e2[k] is positive when there are more negative codes than positive codes, or negative when the number of positive codes exceeds negative codes. Only the sign of e2[k] is needed, not the magnitude.

LMS updater 374 updates the current Least-Mean-Squares estimate a2_lms[k] by subtracting the sign of cost function e2[k] multiplied by the LMS stepsize from the prior LMS estimate e2_lms[k−1]. Moving averager 376 generates the moving average of e2_lms[k] over ma samples to get the average a2 coefficient, a2_avg[k], that is sent to nonlinear channel corrector 362 to correct the data channels.

After each loop of M samples, counter 378 has a new count of negative YC1 samples, so cost function e2[k], a2_lms[k], and a2_avg[k] are recalculated. After several loops of M samples, a2_avg will reach a steady value and nonlinear detector 370 can be paused.

Computational cost for nonlinear detector 370 is very low, since the sign bits of YC codes are merely counted. The YC code can be discarded once counter 378 is incremented. The YC or Y codes do not have to be stored, so a large memory is not need such as for regression or other complex processing. Only addition and multiply operations are needed plus counter 378 and moving averager 376.

Figure 11A:
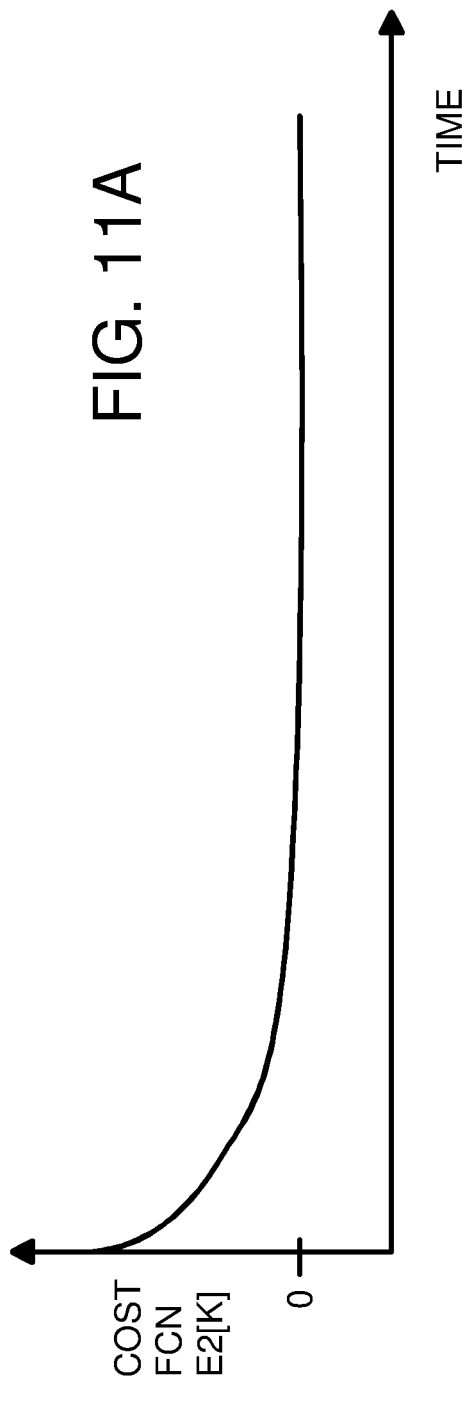
FIGS. 11A-11B show the cost function and average coefficient for removing HD2 errors converging to stable values over time.
Figure 11B:
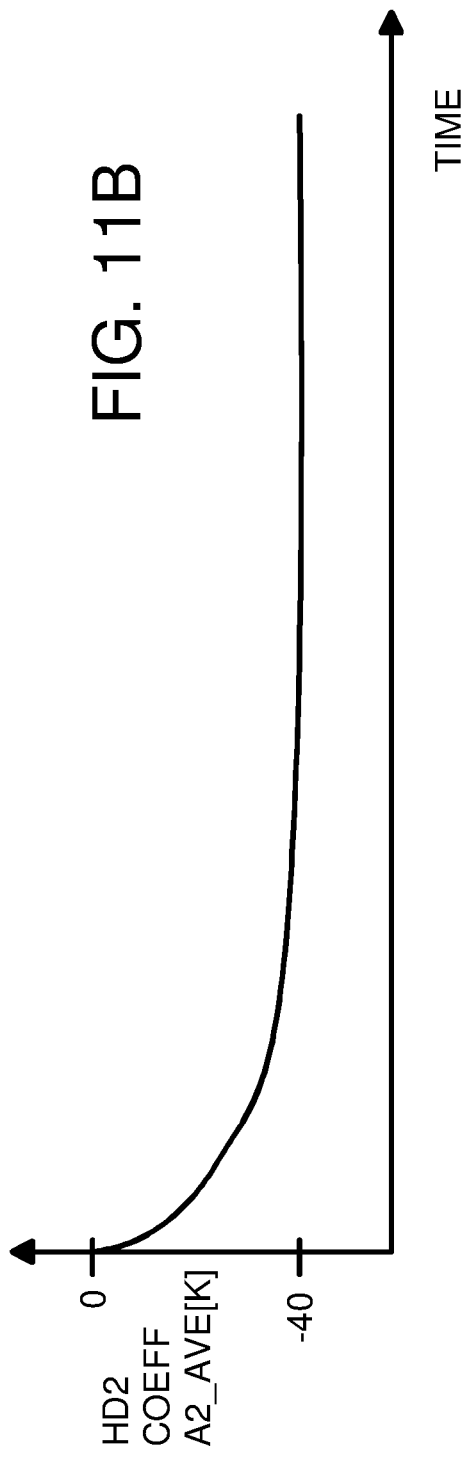

FIGS. 11A-11B show the cost function and average coefficient for removing HD2 errors converging to stable values over time. In FIG. 11A, the second-order HD2 error cost function, e2[k], approaches zero over time as many iterations of the LMS loop are executed. In FIG. 11B, as these loop iterations occur and K increases over time, the averaged HD2 error coefficient, a2_avg[k], approaches a stable value, such as −40.

Figure 12A:
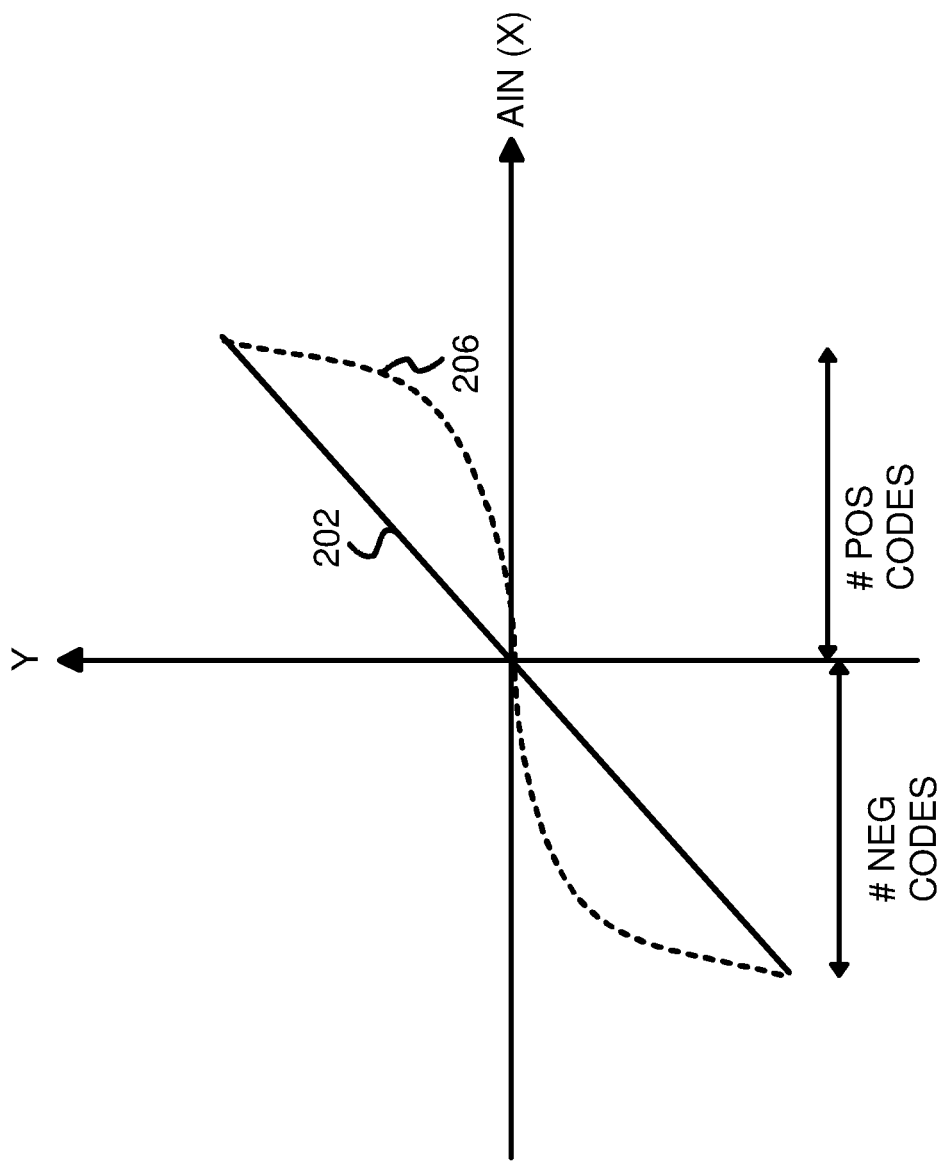
Figure 12B:
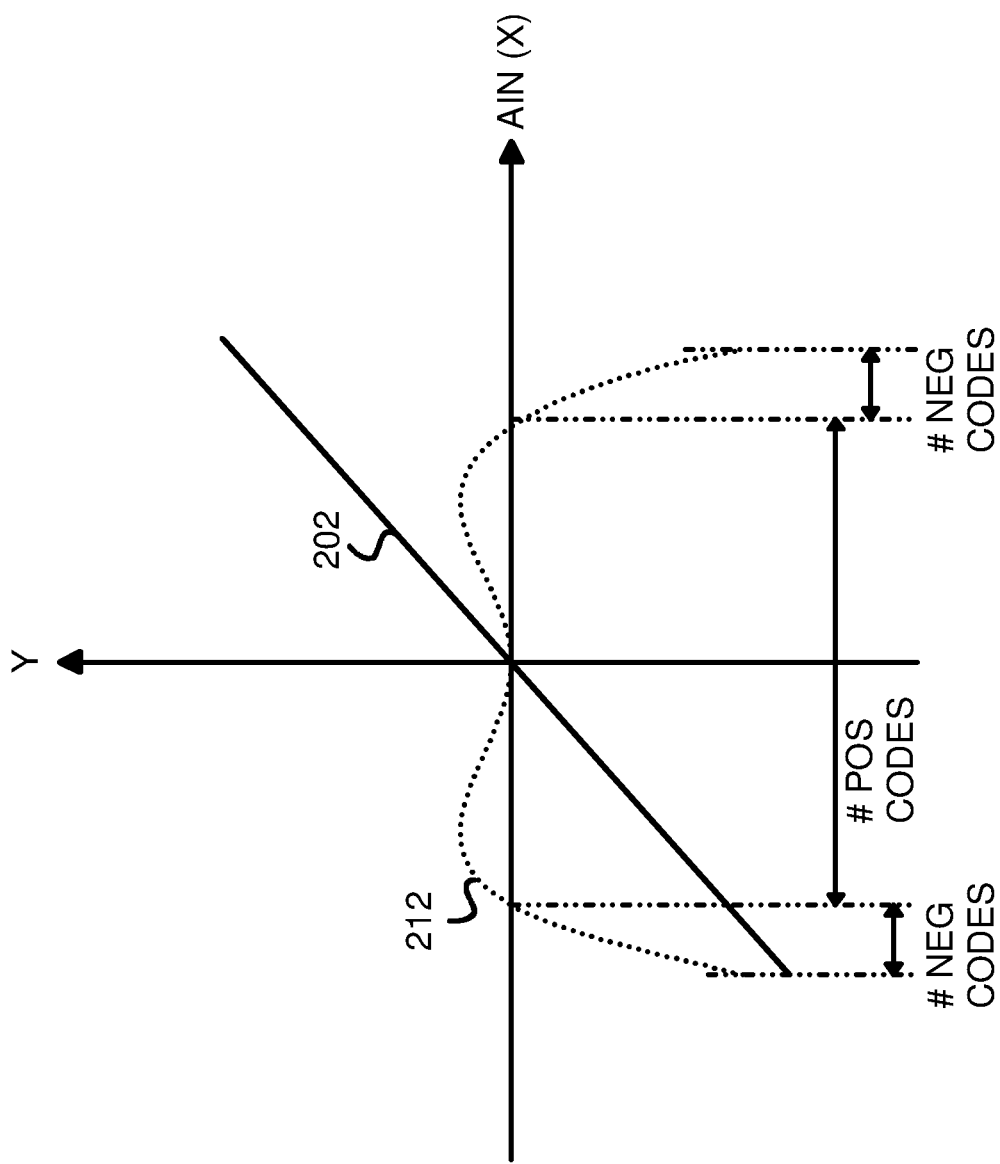

FIGS. 12A-12C show graphs of the polynomial function A and correlation function C for linear and nonlinear outputs highlighting code polarity counting for odd harmonics. Polynomial function A is a function of x over a range, such as −2048 to +2047 for x, or $-V_{REF}/2$ to $V_{REF}/2$ for AIN.

Once HD2 errors have been removed by nonlinear channel corrector 362, only the HD3 errors remain. Then polynomial function A when representing data YC after static and dynamic remover 352 and nonlinear channel corrector 362 can be represented as:

$$A = x + a_3 \cdot x^3$$

In FIG. 12A, when negligible HD2 or HD3 errors exist, such as for reference channel Y0, A is a linear function of x, as shown by ideal line 202 which has no nonlinear errors. However, when only HD3 errors are present, such as for Y1 from data channel 1 after HD2 correction by nonlinear channel corrector 362, then curve 206 represents Y1, when $a_3$ is positive. When $a_3$ is negative, then curve 206 would be mirrored around line 202 with a similar shape.

For the negative values of x, to the left of the y-axis, curve 206 will be below the x-axis, meaning that Y is negative. For positive values of x, to the right of the y-axis, curve 206 is above the x-axis, and Y is positive.

When a small signal is applied to the analog input, and this small signal swings across a wide range of x, the Y codes to the left of the y-axis will be negative Y codes, and the Y codes to the right of the y-axis will be positive Y codes. The number of negative Y codes will always be about equal to the number of positive Y codes.

Unlike the second order function of FIG. 9, the third order function of FIG. 12A cannot be used with the inexpensive negative code counting method for the cost function that was used for HD2.

While even harmonics with even-order polynomial functions can use code counting as cost functions, odd harmonics with odd-order polynomial functions cannot use code counting. Odd polynomial functions (FIG. 9) have equal numbers of negative and positive codes and thus do not have asymmetric code density as does even polynomial functions (FIG. 12A).

The inventor creates the needed code sign asymmetry by converting the odd-order function to an even-order function. Rather than use a cost function that is based on the third polynomial term of A, the inventor uses a cost function that is based on a correlation of channel 1 with the reference channel 0. The correlation introduces asymmetry that can be counted and used as the cost function for HD3.

An error function E can be defined as the difference of polynomial A (channel 1) and reference polynomial R (channel 0):

$$E = A - R$$

the difference between channels 0 and 1 is approximately the nonlinear errors, which are the square and cube polynomial terms:

$$\approx a_2 \cdot x^2 + a_3 \cdot x^3$$

Reference function R for reference channel 0 contains only a linear term since offset has been cancelled by static and dynamic remover 352 and attenuation diminishes any higher terms.

A correlation of reference function R with error function E is:

$$C = R \times E = a_1 \cdot x \times (a_2 \cdot x^2 + a_3 \cdot x^3)$$

or $$= a_1 \cdot a_2 \cdot x^3 + a_1 \cdot a_3 \cdot x^4$$

since channels 0 and 1 are both gain corrected by static and dynamic remover 352, $a_1$ can be set to 1, and C is then:

$$C = R \times E = a_2 \cdot x^3 + a_3 \cdot x^4$$

In this correlation C the third-order coefficient $a_3$ is multiplied by $x^4$ and thus $a_3$ is converted to a fourth-order term. The fourth-order term is an even-order term.

FIG. 12B shows curve 212, which plots correlation function C=Y0*(YC1−Y0). Curve 212 has code asymmetry, even though it is symmetric around the y-axis. The number of positive codes, where curve 212 is above the x-axis, is greater than the number of negative codes, where curve 212 is below the x-axis. Thus curve 212 has code asymmetry similar to curve 204 in FIG. 9. By using a correlation function C, the inventor has converted a third-order (odd) term to an even term that has code asymmetry and thus can use negative code counting as an inexpensive cost function.

Since the second order coefficient $a_2$ is converted to an odd harmonic by being multiplied by $x^3$ in the correlation function C, it will have a symmetric code distribution with equal numbers of even and odd codes, and thus will not interfere with $a_3$ code counting.

Second-order coefficient $a_2$ is adjusted using nonlinear detector 370A of FIG. 10, so the $a_3$ coefficient can be adjusted using another LMS loop that uses correlation function C. In this second LMS loop, R is Y0 from reference channel 0, and A is YC1 that is channel 1 corrected for nonlinear errors by nonlinear channel corrector 362. Then correlation function C can be written as:

$$C = Y0 * (YC1 - Y0).$$

The inventor observes correlation function C, calculated from Y0 and YC1, over a range of M values that includes at least one small-signal cycle over a wide range of x values. The sign bit of C is used to increment a counter of negative C values. The ratio of neg_C_count/M, or a difference (neg_C_count−pos_C_count), or similar measures, can be used as a cost function. The cost function then adjusts coefficient $a_3$ to nonlinear channel corrector 362, and the cost function is recalculated over another M samples to further correct $a_3$ until the HD3 error is adequately compensated for.

In FIG. 12C, since correlation function C, curve 212, is an even-order function, it has code asymmetry. The number of positive codes exceeds the number of negative codes. As $a_3$ is adjusted, curve 212 should flatten to become closer to corrected curve 216, in which the number of positive and negative codes match. If $a_3$ overcompensates HD3 correction, then the sign of $a_3$ will invert. Over time $a_3$ will approach a stable value that minimizes the remaining HD3 error. Corrected curve 216 has an equal number of positive and negative codes, so the difference in the numbers of negative and positive C codes can serve as a cost function to be minimized. Corrected curve 216 lies on the x-axis when all HD3 errors have been perfectly corrected.

Figure 13:
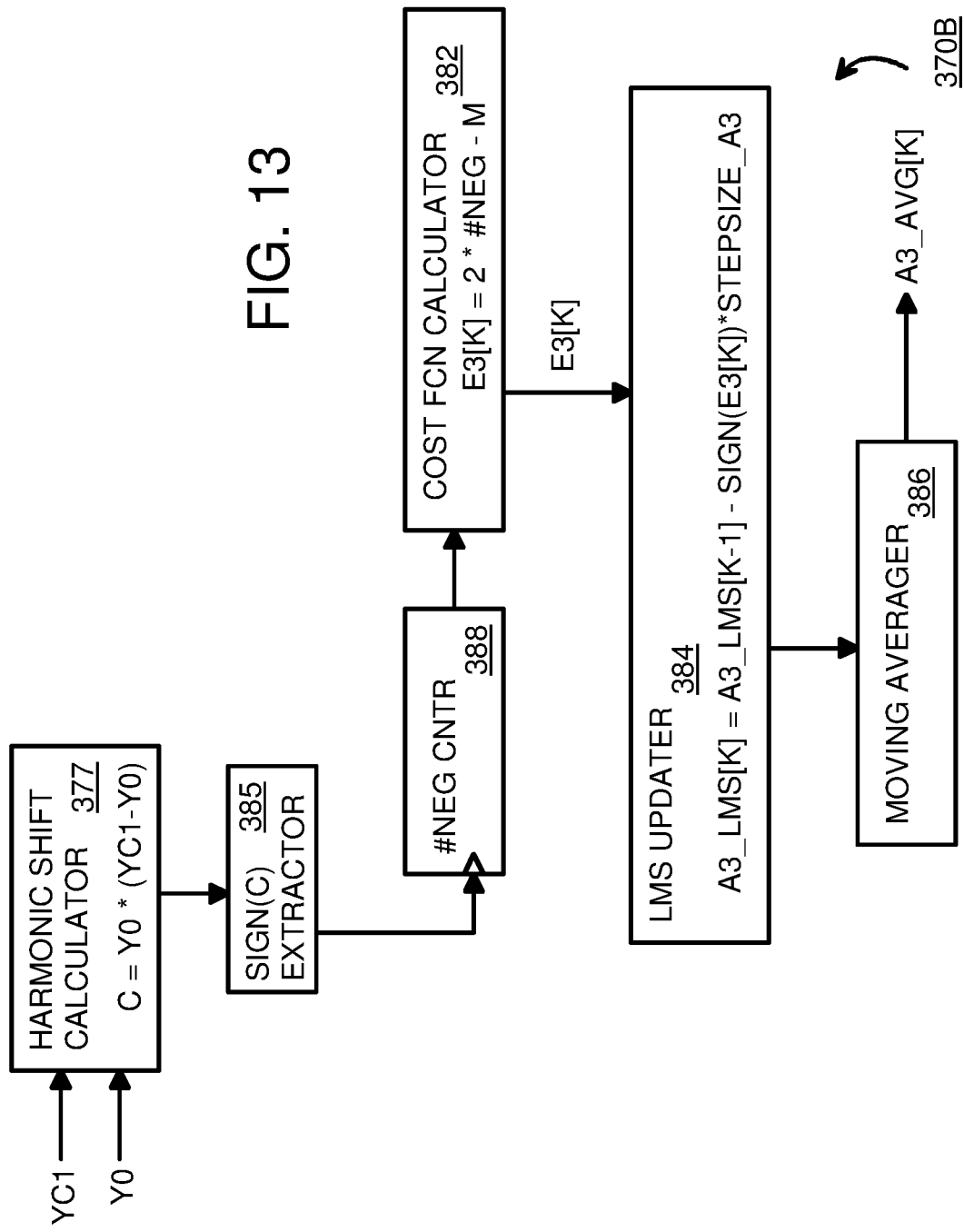
FIG. 13 is a diagram of the nonlinear detector for HD3 errors.

FIG. 13 is a diagram of the nonlinear detector for HD3 errors. Nonlinear detector 370 includes nonlinear detector 370A (FIG. 10) for detecting second harmonic HD2 errors and nonlinear detector 370B that detects third harmonic HD3 errors.

A time-varying input is applied to the analog input AINP, AINN, and static and dynamic remover 352 removes static and dynamic errors to generate Y1 for channel 1. The nonlinear errors predicted by a2_avg, a3_avg are removed from Y1 using nonlinear channel corrector 362 to generate nonlinear-corrected output YC1.

For the reference channel, another static and dynamic remover 352 removes static and dynamic errors to generate Y0 for channel 0. Since reference channel 0 has an attenuated input, nonlinear HD2 and HD3 errors are negligible, and nonlinear channel corrector 362 is not needed, so YC0=Y0.

Harmonic shift calculator 377 calculates the correlation C between reference channel 0 and data channel 1. The output from static and dynamic remover 352 for channel 0, Y0, is correlated with output YC1 from nonlinear channel corrector 362 for channel 1, which has been corrected for nonlinear errors using the current estimates a2_avg, a3_avg. Harmonic shift calculator 377 calculates correlation C as Y0 times the difference of YC1 and Y0, or C=Y0*(YC1−Y0).

Sign extractor 385 extracts the sign from each correlated sample C from harmonic shift calculator 377. For two's complement format, the sign is the leading bit which is 1 for negative and 0 for positive. When the sign is 1, negative code counter 388 is incremented. After M samples, counter 388 contains the number of negative C correlation codes before counter 388 is reset for the next group of M samples.

Cost function calculator 392 generates the cost function e3[k] by doubling the negative code count from counter 388 and subtracting the total number of samples M. Cost function e3[k] is positive when there are more negative codes than positive codes, or negative when the number of positive codes exceeds negative codes. Only the sign of e3[k] is needed, not the magnitude.

LMS updater 384 updates the current Least-Mean-Squares estimate a3_lms[k] by subtracting the sign of cost function e3[k] multiplied by the LMS stepsize from the prior LMS estimate e3_lms[k−1]. Moving averager 386 generates the moving average of e3_lms[k] over ma samples to get the average a3 coefficient, a3_avg[k], that is sent to nonlinear channel corrector 362 to correct the data channels.

After each loop of M samples, counter 388 has a new count of negative correlated samples, so cost function e3[k], a3_lms[k], and a3_avg[k] are recalculated. After several loops of M samples, a3_avg will reach a steady value and nonlinear detector 370B can be paused.

Computational cost for nonlinear detector 370 is very low, since the sign bits of correlated Y0*(YC1−Y0) codes are merely counted. The C code can be discarded once counter 388 is incremented. The YC or Y or C codes do not have to be stored, so a large memory is not need such as for regression or other complex processing. Only addition and multiply operations are needed plus counter 388 and moving averager 386. Harmonic shift calculator 377 can be a simple subtractor and multiplier.

Figure 14A:
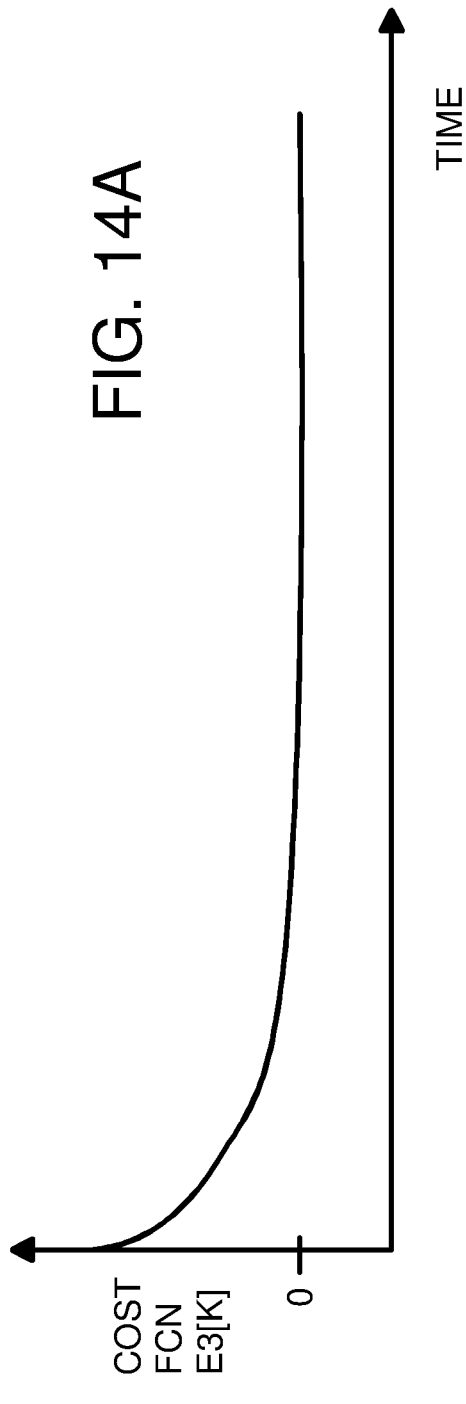
FIGS. 14A-14B show the cost function and average coefficient for removing HD3 errors converging to stable values over time.
Figure 14B:
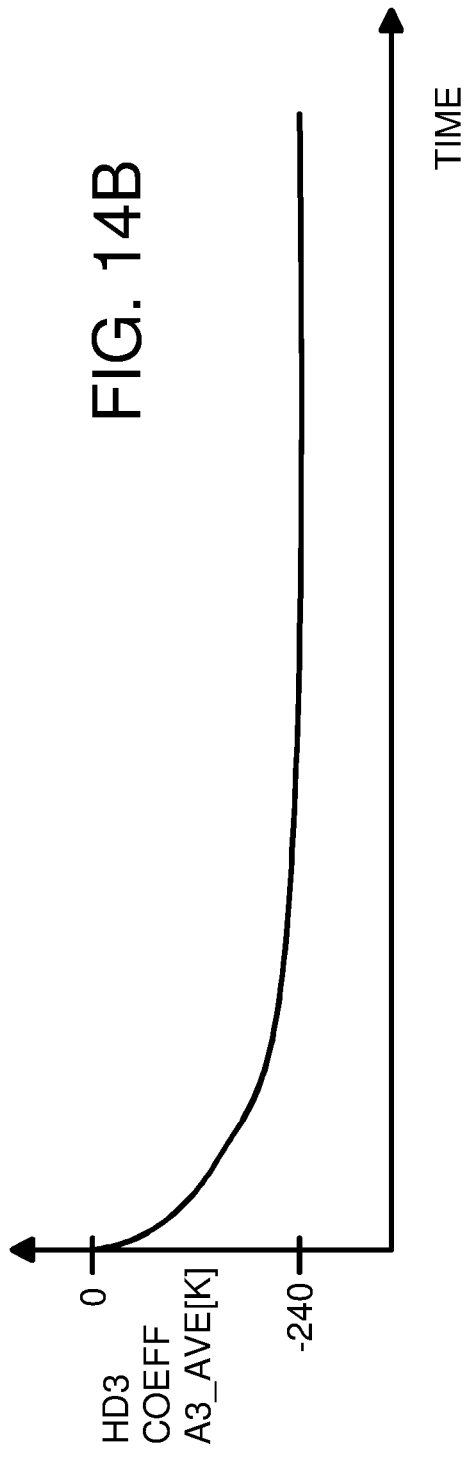

FIGS. 14A-14B show the cost function and average coefficient for removing HD3 errors converging to stable values over time. In FIG. 14A, the third-order HD3 error cost function, e3[k], approaches zero over time as many iterations of the LMS loop are executed. In FIG. 14B, as these loop iterations occur and K increases over time, the averaged HD3 error coefficient, a3_avg[k], approaches a stable value, such as −240.

FIG. 15 is a graph of spurious tones in a spectrum for an interleaved ADC with nonlinear errors. Mismatches may introduce non-linearities or errors that cause spurious tones 303, 305. These spurious tones can occur at integer multiples of Fs/N, K*Fs/N±F, wherein K is an integer, where Fs is the sampling frequency (period Ts=1/Fs) causing primary peak 301, F is the input frequency of a tone, and N is the number of channels interleaved together. In this example, spurious tones are prominent on F*K where K=1, 2, 3. For K=2, it is second harmonic, and K=3 is third harmonic, assuming F*3<Fs/2. These spurious tones are undesirable since they can restrict the dynamic range of high-speed ADCs and are proportional to analog input signal amplitude and frequency. For example, spurious tone 303 is a second harmonic distortion HD2 of about −53 dB, while spurious tone 305 is a third harmonic distortion HD3 of about −49 dB.

Figure 16:
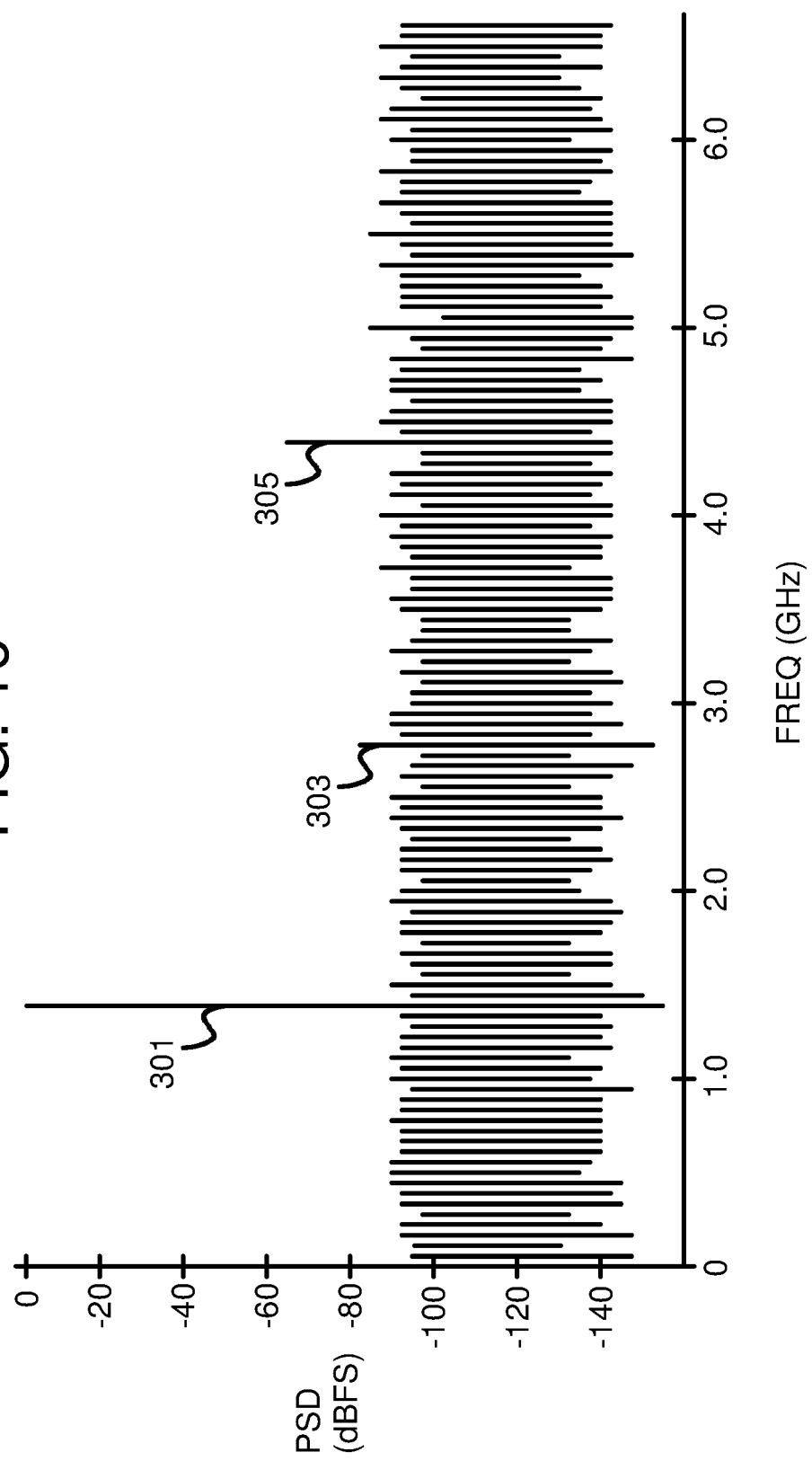
FIG. 16 is a graph of reduced spurious tones in a spectrum for an interleaved ADC with nonlinear error detection and correction by counting negative Y values.

FIG. 16 is a graph of reduced spurious tones in a spectrum for an interleaved ADC with nonlinear error detection and correction by counting negative Y values. Nonlinearity errors are compensated for by nonlinear channel corrector 362 based on second and third harmonic correction coefficients a2_avg and a3_avg generated by nonlinear detector 370 by counting negative Y codes.

This HD2, HD3 correction reduces the amplitude of spurious tones 303, 305. The amplitude of spurious tones 303, 305 are reduced when compared with spurious tones 303, 305 of FIG. 15. For example, spurious tone 303 is a second harmonic distortion HD2 that is reduced to about −90 dB from about −53 dB, while spurious tone 305 is a third harmonic distortion HD3 that is reduced to about −68 dB from about −49 dB. THD is improved by about 19 dB. The limitation on HD3 depends on how linear is reference channel ADC0. If input buffer 31 was designed with 6 dB or better in nonlinearity, the overall THD performance can be improved more than 25 dB.

Figure 17:
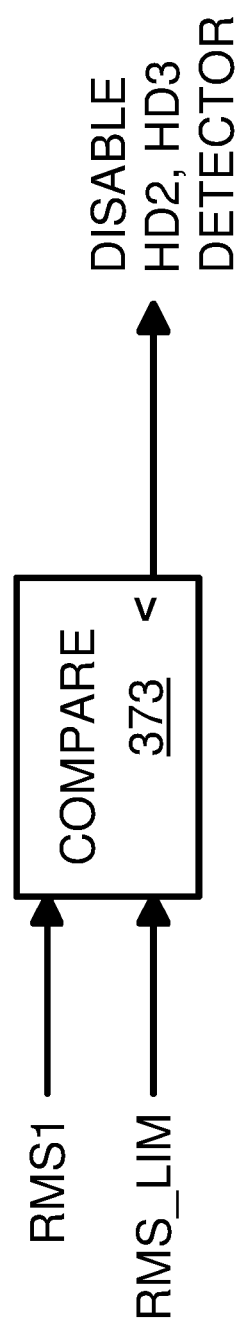
FIG. 17 is a disable comparator that turns off nonlinear error correction when power is low.

FIG. 17 is a disable comparator that turns off nonlinear error correction when power is low. Nonlinear detector 370 and nonlinear channel corrector 362 operate well under high and moderate signal amplitudes, such as −15 dBFS. When input power is weak, the nonlinear error generates is small and HD2, HD3 errors are not as significant.

When power is low, nonlinear detector 370 and nonlinear channel corrector 362 can be disabled or powered down. The reference path, including ADC 10 and static and dynamic remover 352 for channel 0 could also be powered down.

Comparator 373 compares the RMS power of channel 1, RMS1, such as from moving RMS generator 282 in static and dynamic remover 352 for channel 1, to a power limit, RMS_LIM, and sends a disable signal to nonlinear detector 370 and/or nonlinear channel corrector 362 to cause them to stop detecting and correcting HD2 and HD3 errors when the power is below the power limit. The power limit can be set to a value such as ⅓ of full RMS power, or to other values. Thus HD2 and HD3 error correction can be adaptively used for higher power input signals that are more prone to HD2 and HD3 errors, while disabled for low power input signals that are less prone to HD2, HD3 errors.

ALTERNATE EMBODIMENTS

Several other embodiments are contemplated by the inventor. For example clocks may be derived from other clocks and synchronized. Clocks may be buffered, enabled, and qualified by logic. The analog input signal may be buffered in a variety of ways and buffer arrangements or trees. Linear attenuator 35 may be located in other locations within the front-end analog buffering network. In FIG. 17, Comparator 373 can disable nonlinear detector 370 only or also disable nonlinear channel corrector 362.

Active-low rather than active-high SAR, counters, and other bits could be used. Various parameters may be varied. For example, M may have different values for the number of samples averaged for offset correction than for gain correction, or for other steps of functions. For example, M can be 16384 or more in one embodiment. K could have one value for the HD2 loop, but another value for the HD3 loop. M may depend on the stepsize.

HD2 coefficient calibration could be performed first by forcing a3lms or a3avg to a fixed value until a2avg reaches a stable value, when HD3 coefficient calibration could begin. Alternately, HD2 and HD3 coefficients could be searched for at the same time, with the HD2 and HD3 counter LMS loops of FIGS. 10, 13 operating at the same time.

While a simple correlation function C has been shown to shift the third-order coefficient a3 to an even power of x, other correlation functions or other harmonic-shifting functions could be substituted.

The present invention shows the simplest known implementation method for HD3 coefficient detection and correction, when the analog input can have any signal profile. However, when the analog input signal is restricted to being a pure sine wave, a special example for detecting HD3 is to use self-correlation such as YC1*YC1 where a single tone (sine or cosine) can mix the third harmonic down to the second harmonic because the fundamental input frequency F mixed with 3*F forms 2*F and 4*F tones in the spectrum, which can be used as a cost function of the third harmonic. But this special case only works for a single tone scenario (only one sine or cosine waveform at one frequency on the entire Nyquist bandwidth). The present invention in general doesn't have such constraints for any signal function and combination.

A large data storage is not required to store output codes such as Y or YC since the cost functions are not generated from polynomial regression or other complex mathematical functions that require high computational effort. Instead, YC1 codes and correlation codes C have their sign bits increment counters, allowing the YC1 and C codes to be discarded. The two negative code counts in counters 378, 388 are the only values that need to be keep over many samples. By simply observing the polarity of YC1 or C (itself a simple function of YC1 and Y0), the count can be updated and the cost function later calculated for each loop iteration. Thus storage and logic die area are minimized and cost and power reduced. Codes are counted and discarded in real time.

The overhead of the reference channel is minimal, since it is a copy of the other data channels. When there are many data channels interleaved together, such as 32 or 64, the relative overhead of the one extra reference channel is reduced. The additional design effort for the added reference channel is minimal.

THD can be improved by 15 dB and the dynamic range by 20 dB. Since all static and dynamic mismatches are removed from the reference channel as well as the data channels, nonlinear error detection and correction is robust to these mismatch errors.

For extra THD performance, analog input buffer 31 (FIG. 5) to the reference channel can be designed with 6 dB better in linearity than input buffer 30 to the data channels. While input buffer 31 should be kept with a reasonably small delay mismatch with input buffer 30, this mismatch can be later corrected by timing skew calibration via SAR delay 40. This can potentially improve HD3 performance by 6 dB more after correction compared to a replica reference channel approach. So, the present invention doesn't restrict input buffer 30 and 31 to be the same. This can facilitate ultra-high speed ADC such as 10 GS/s 12b ADC.

Since the reference channel analog input is attenuated from the data channel analog inputs, any analog input signal can be supported. Nonlinear detector 370 can operate in real time as the ADC converts real data during normal operation, but nonlinear detector 370 can also operate in the background or at designated times. Nonlinear errors can be tracked and compensated for across environmental changes such as for supply, temperature, humidity, and aging. During periods of low power input, nonlinear detector 370 can be disabled when linearity is good. Nonlinear channel corrector 362 could also be disabled. Nonlinearity errors can be adaptively processed based on power conditions.

Rather than counting negative codes, counters 378, 388 could count positive codes. Incrementing could be by +1, or by −1, or by some other increment value. The cost functions could be calculated in different ways to still be able to update the LMS loops effectively. Different loop stepsizes and averaging periods could be used. Other correlation functions C could be used.

Since HD3 errors sometimes are smaller than HD2 errors, nonlinear detector 370 can first set a3_avg to zero and focus on adjusting a2_avg to minimize the HD2 error. Then once a stable value of a2_avg is found, nonlinear detector 370 can keep using this stable value of a2_avg and adjust a3_avg until the HD3 error is also removed to a desired degree. Alternately, nonlinear detector 370 can adjust both a2_avg and a3_avg at the same time. The algorithm works when both nonlinear errors terms are detected at the same time since the cost functions e2[k] and e3[k] are different and they focus on exactly second and third harmonic coefficients, respectively, but not correlation with each other. Therefore the two LMS loops for e2[k] and e3[k] are independent and may work towards convergence at the same time.

SAR delay 40 could employ binary-weighted capacitors or other weighted delay elements, such as resistors, transistors or buffers of various sizes or weights. While binary-weighted capacitors have been described, other weightings could be substituted, such as decimally-weighted, prime-weighted, or linearly-weighted, or octal-weighted. The digital delay value in the SAR could be in these other number systems, such as octal numbers rather than binary numbers. Other kinds of delay elements could be substituted, such as parallel current sources, resistors, or various combinations, and in parallel, serial, or combined network arrangements. Values may be shifted, transformed, or processed in a variety of ways.

While product derivative correlator 52 has a particular midpoint correlation, other correlation functions could be substituted and product derivative correlator 52 adjusted to perform these substitute correlation functions. Inversions and complements may be added at various locations.

Switches 20, 22, 23, 24 may be simple transistor switches, pass transistors, transmission gates, or other kinds of switches. A latch or other storage element may be used as a delay with combinational logic including NAND, NOR, XOR, XNOR gates. Rather than use capacitors for delay elements, MOSFETs, FinFETs, or other devices, either p-channel or n-channel, driven to power or ground, may be used as delay elements.

While the first channel's SAR delay 41 may be initialized to the midpoint value of 1000 . . . 0, a different channel could be initialized, or the initial value could be another value, such as 0100 . . . 0, 0010 . . . 0, etc. Any channel could act as the fixed timing reference, and the timing delay of that fixed reference could be any value.

Matrix processor 50 may use a Digital Signal Processor (DSP) or other processor that is efficient when performing matrix operations. Product derivative correlators 52 may be implemented in hardware and in parallel for high-speed calibration. Various combinations of hardware, firmware, and software may be used in these implementations and for calibrator 55 and for other components. While matrix processing and correlation has been described for dynamic calibration, other kinds of processing and calibration could be substituted to program the SAR delay cells to adjust input sampling clock skews.

A FIR filter may be added to the output of each ADC channel to act as a lowpass or bandpass filter for calibration, or for a bypass, if the polarity of its correlation derivatives is known. FIR filtering can help define the polarity of its correlation derivatives to a well-defined value or specification to calibrate the interleaved ADC for a known frequency range. Since correlation derivatives are frequency dependent, FIR filtering can prevent any potential convergence problems during calibration.

While some operations have been described in a parallel manner for faster processing, serial operation may be used. When performed serially, a single instance of product derivative correlator 52 could be used rather than separate instances of product derivative correlator 52 in the hardware. While a bank of N product derivative correlators 52 have been shown, product derivative correlators 52 could be re-used or operate in various series and parallel arrangements.

Any process steps could be performed serially, or some steps may be performed in parallel. Various sequences may be adjusted or modified. Higher-level operations may be performed in software or firmware, such as SAR testing and decision logic, while lower-level functions may be performed in hardware, such as using product derivative correlator 52 to generate product derivative factors F1, F2, F3, F4. Some or all of the calibration routine could be replaced with hardware such as programmable logic, FPGA, or other logic gates on an Integrated Circuit (IC) or another chip. Various combinations of hardware, software, firmware, etc. may be substituted.

Product derivative correlators could operate upon more than 3 inputs as another alternative. Analog input buffers could be rearranged, so that one analog input buffer drives 4 or 2 ADCs, or there may be a tree structure of analog input buffers with multiple levels.

The number of samples averaged M and the number of samples in each loop iteration K could be different for foreground and background calibration and could even differ for different capacitor bit-positions, such as more samples for LSB's that are more sensitive and fewer samples for MSBs. M, K, and other parameters could also differ for other reasons such as varying voltage or temperature conditions. Different values of M could be used for different calibration processes.

The invention doesn't restrict the input frequency of an analog signal, except for a criterion that the analog signal is within a Nyquist bandwidth (i.e. 0 to Fs/2 of overall sampling rate of an N-channel interleaved ADC). If the analog signal is in a second Nyquist zoom (such as Fs/2 to Fs) then all the matrix sign bits are inverted for the calculated results from the matrix processor. So the user can set an appropriate signal frequency region to adapt to their application.

The analog input signal AIN does not have to be a sine wave, but could be other forms of AC signals, such as a linear ramp, cosine, two-tone, multi-tone, triangular wave, bandlimited white noise, raise cosine, uniform random, sine waves of different frequencies that are superimposed, or any wireless baseband signal. Nonlinear detector 370 can adapt for many different kinds of analog input signals using inexpensive code counting.

Averaging of the product derivative factors F1, F2, F3, F4 could be performed by setting a flip-flop when the sign bit is 1 and clearing the flip-flop when the sign bit is 0 for the current sum. A flip limit FL may be used for ending background calibration when incrementing the LSB keeps flipping sign bits more than the FL times. Alternately, background calibration can end when the sign bits first flip.

The number of channels N can be binary, non-binary, even or odd. While 4 channel interleaving has been shown in detail, 8-channel, 7-channel, 6-channel, 16-channel, 32-channel, or N-channel interleaved ADC's may be substituted. The interleave order of the channels may be changed. Interleaving may be nested or may be one long loop at level 1. Interleaving is not needed to practice the invention. A single data channel and a single reference channel can be used without interleaving, with N=1.

In FIG. 5, linear attenuator 35 can be a fixed constant type of attenuator or a programmable type. The attenuation factor can be user determined, such as according to the signal power of the analog signal.

Rather than have the reference ADC path be identical in size to the data ADC path, the reference path can be scaled in size. For example, in FIG. 5, the reference ADC path (input buffer 31 and ADC 10) can be scaled down in size by some factor (such as 1/3 or 1/4) from the size of main data ADC paths (input buffer 30 and ADC 11) as long as the delay mismatch between the reference ADC and the main data ADC is kept within a certain range that can be corrected by timing skew calibration. Thus the delay can be kept constant if circuit and parasitic parameters are scaled down by the same factor when scaling the reference ADC path.

FIGS. 5, 7 show using the first data channel YC1 for HD2 calibration. However, any one of the data channels may be input to nonlinear detector 370, as long as its clock is also applied to the reference channel. For example, YC3 could be input to nonlinear detector 370 rather than YC1, and TS3 applied to SAR delay 40 for the reference channel.

As another alternative, more than one data channel may be input to nonlinear detector 370. For example all data channels YC1-YC4 may be separately counted by nonlinear detector 370, using four counters 378 (FIG. 10). Then cost function calculator 312 generates four cost functions, e2_1 [k], e2_2[k], e2_3[k] and e2_4[k], one for each data channel. Cost function calculator 312 then calculates an average cost function by summing the four cost functions, e2_1[k], e2_2[k], e2_3[k] e2_4[k], and dividing by 4 to get an averaged cost function e2[k]. LMS updater 374 then uses this averaged cost function e2[k] to update a2_lms[k], and moving averager 376 generates a2_avg[k] as described before, which is applied to nonlinear channel corrector 362 for all data channels. One data channel, or any group of data channels, or all data channels can be averaged together to update the LMS loop.

In a further extension of this alternative, all the components in FIG. 10 are replicated for each data channel and operate in parallel. Counter 378, cost function calculator 312, LMS updater 374, averager 376 are all replicated for each data channel, and four average coefficients a2_avg[k] are generated: a2_avg_1[k], a2_avg_2[k], a2_avg_3[k] a2_avg_4[k], each applied to the nonlinear channel corrector 362 for that channel.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation. Inversions may be added, or extra buffering. Capacitors may be connected together in parallel to create larger capacitors that have the same fringing or perimeter effects across several capacitor sizes. Switches could be n-channel transistors, p-channel transistors, or transmission gates with parallel n-channel and p-channel transistors, or more complex circuits, either passive or active, amplifying or non-amplifying.

The number of ADC digital bits may be adjusted. For example, a 15-bit ADC could be used, or an 8-bit, 6-bit, 22-bit, or 18-bit. A different number of bits could be substituted for a different precision, and the number of bits could be fixed or could be variable.

Detection and correction of analog input buffer and switching nonlinearities in the digital domain is more desirable. Especially for current 10 nm and below process technology, logic power is often less than analog power usage. Thus a digital-assisted calibration algorithm for correcting nonlinearity is preferable to analog correction. Because the input signal profile varies in parameters such as signal swing, signal frequency, and signal types, the code-counting calibration loop described herein should be useful for background and adaptive calibration algorithms to track changes over environmental conditions.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A correlation-code sign-counting method to detect third-order nonlinear errors in an Analog-to-Digital Converter (ADC) comprising:
   (a) receiving a reference code that is output by a reference channel having a reference ADC receiving an attenuated analog input generated by attenuating an analog input;
   receiving a nonlinear-corrected code from a nonlinear channel corrector, the nonlinear channel corrector receiving a data code output by a data channel having a data ADC receiving the analog input;
   generating a correlation code by generating a difference of the nonlinear-corrected code and the reference code, and multiplying the difference by the reference code;
   incrementing a counter when a sign of the correlation code is negative, and not incrementing the counter when the sign of the correlation code is positive;
   repeating from (a) for M samples of the analog input, wherein M is a whole number of at least 16384 and the analog input changes over a range of the analog input;
   calculating a cost function by doubling a count value of the counter and subtracting M;
   resetting the count value when the cost function is generated;
   updating a loop coefficient by subtracting a stepsize multiplied by a sign of the cost function from a prior value of the loop coefficient;
   averaging the loop coefficient to generate an averaged third coefficient;
   repeating from (a) for at least K values of the cost function, wherein K is a whole number of at least 256;
   generating the nonlinear-corrected code using the nonlinear channel corrector by adding a third term to a code input to the nonlinear channel corrector from the data ADC, and generating the third term by dividing the code input by a range of the code input to get a normalized code value, cubing the normalized code value to get a cubed value, and multiplying the cubed value by the averaged third coefficient to generate the third term,
   whereby third-order harmonic distortion (HD3) errors are detected and corrected using the counter incremented by the sign of the correlation code.

2. The correlation-code sign-counting method of claim 1 further for detecting second-order nonlinear errors in the ADC further comprising:
   incrementing a second counter when a sign of the nonlinear-corrected code is negative, and not incrementing the second counter when the sign of the nonlinear-corrected code is positive;
   repeating from (a) for M samples of the analog input, wherein M is a whole number of at least 16384 and the analog input changes over a range of the analog input;
   calculating a second cost function by doubling a second count value of the second counter and subtracting M;
   resetting the second count value when the second cost function is generated;
   updating a second loop coefficient by subtracting a second stepsize multiplied by a sign of the second cost function from a prior value of the second loop coefficient;
   averaging the second loop coefficient to generate an averaged second coefficient;
   repeating from (a) for at least K2 values of the second cost function, wherein K2 is a whole number of at least 256;
   generating the nonlinear-corrected code using the nonlinear channel corrector by further adding a second term to the code input to the nonlinear channel corrector from the data ADC, and generating the second term by squaring the normalized code value to get a squared value, and multiplying the squared value by the averaged second coefficient to generate the second term,
   whereby second-order harmonic distortion (HD2) errors are detected and corrected using the second counter incremented by the sign of the nonlinear-corrected code.

3. A nonlinear-error-corrected Analog-to-Digital Converter (ADC) comprising:
   an analog front end receiving an analog input;
   an attenuator in the analog front end for attenuating the analog input to generate an attenuated analog input;
   a data channel receiving the analog input and a channel sampling clock;
   a reference channel receiving the attenuated analog input and the channel sampling clock also received by a data channel;
   wherein the data channel and the reference channel each comprises:
      an ADC for converting a sampled analog input into a digital output for a channel, the digital output having a digital value representing the sampled analog input for the channel;
      an analog switch that samples an analog input in response to a delayed clock;
      a static error corrector for correcting the digital output for offset, gain, and mismatch errors;
   wherein the channel further comprises:
      a nonlinear channel corrector receiving a second coefficient and a third coefficient, and also receiving the digital output for the channel from the static error corrector;

the nonlinear channel corrector adding a second error term and adding a third error term to the digital output for the channel to generate a corrected digital output for the channel;

the nonlinear channel corrector generating a normalized code value by dividing the digital output by a range of the digital output;

the nonlinear channel corrector squaring the normalized code value to get a squared value, and multiplying the squared value by the second coefficient to generate the second error term;

the nonlinear channel corrector cubing the normalized code value to get a cubed value, and multiplying the cubed value by the third coefficient to generate the third error term;

a nonlinear detector that receives the corrected digital output for the data channel and generates the second coefficient, the nonlinear detector further comprising:
a second counter that is incremented by a sign bit of the corrected digital output for the data channel to generate a second count;
a second cost function calculator that generates a second cost function as a function of the second count and that resets the second counter when the second cost function is calculated; and
a second loop updater that updates the second coefficient by subtracting a sign of the second cost function multiplied by a second stepsize from a prior value of the second coefficient, whereby sign bits are counted to generate the second cost function to update the second coefficient for nonlinear error correction.

4. The nonlinear-error-corrected ADC of claim 3 wherein the analog input receives a sine wave or a cosine wave,
wherein the nonlinear detector also receives the digital output for the reference channel after correction by the static error corrector, and generates the third coefficient, the nonlinear detector further comprising:
a correlation generator that generates a correlation code by squaring the corrected digital output for the data channel to generate the correlation code;
a third counter that is incremented by a sign bit of the correlation code to generate a third count;
a third cost function calculator that generates a third cost function as a function of the third count and that resets the third counter when the third cost function is calculated;
a third loop updater that updates the third coefficient by subtracting a sign of the third cost function multiplied by a third stepsize from a prior value of the third coefficient.

5. The nonlinear-error-corrected ADC of claim 3 further comprising:
the nonlinear detector also receiving the digital output for the reference channel after correction by the static error corrector, and generates the third coefficient, the nonlinear detector further comprising:
a correlation generator that generates a correlation code by generating a difference of the corrected digital output for the data channel and the digital output for the reference channel, and multiplies the difference by the digital output for the reference channel to generate the correlation code;
a third counter that is incremented by a sign bit of the correlation code to generate a third count;
a third cost function calculator that generates a third cost function as a function of the third count and that resets the third counter when the third cost function is calculated;
a third loop updater that updates the third coefficient by subtracting a sign of the third cost function multiplied by a third stepsize from a prior value of the third coefficient.

6. The nonlinear-error-corrected ADC of claim 5 wherein the nonlinear detector further comprises:
a second averager that averages the second coefficient;
a third averager that averages the third coefficient.

7. The nonlinear-error-corrected ADC of claim 6 wherein the second cost function generator further comprises:
a doubler for doubling the second count to generate a doubled second count;
a subtractor for subtracting a sample count from the doubled second count to generate the second cost function;
wherein the sample count is a number of samples of the digital output processed since a preceding reset of the second counter;
wherein the third cost function generator further comprises:
a doubler for doubling the third count to generate a doubled third count;
a subtractor for subtracting the sample count from the doubled third count to generate the third cost function.

8. The nonlinear-error-corrected ADC of claim 7 wherein the data channel and the reference channel each further comprises:
a Successive-Approximation-Register (SAR) that is programmed with a delay value during dynamic calibration; and
a variable delay element having a variable delay that is controlled by the delay value stored in the SAR, the variable delay element delaying the channel sampling clock received for the channel by the variable delay to generate the delayed clock to the analog switch; and
a dynamic error calibrator for correcting the digital output for data channel and for the reference channel, by adjusting the delay values programmed into the SAR by using a dynamic calibration routine.

9. The nonlinear-error-corrected ADC of claim 8 further comprising:
a plurality of N channels that includes the data channel, wherein N is a whole number of at least 3;
a multi-phase clock generator for generating a plurality of channel sampling clocks having different phases;
wherein each of the plurality of N channels receives a channel sampling clock in the plurality of channel sampling clocks;
an output interleaving mux for alternately selecting the corrected digital output from among the plurality of N channels.

10. The nonlinear-error-corrected ADC of claim 9 wherein the dynamic error calibrator further comprises:
a channel correlator for each of the plurality of N channels and for the reference channel, the channel correlator for correlating the digital output of the channel to the digital output of adjacent channels in the plurality of N channels and the reference channel to generate a product derivative factor for the channel; and
a correlation processor for receiving the product derivative factor for each of the plurality of N channels and for the reference channel and for generating a sign vector having a correlation sign for the reference channel and for N of the plurality of N channels;
wherein the SAR is programmed with delay values to compensate for timing skews among the plurality of N channels using a Successive-Approximation calibration routine that examines the correlation sign in the sign vector to determine when to accept or reject trial bits in the SAR of a channel corresponding to the correlation sign in the sign vector.

11. The nonlinear-error-corrected ADC of claim 10 wherein the correlation processor comprises a matrix processor.

12. The nonlinear-error-corrected ADC of claim 11 wherein the static error corrector further comprises:
an offset corrector that averages the digital output for the channel from the ADC to generate a moving average that is subtracted from the digital output to generate an offset-corrected digital output;
a gain corrector that generates a moving root-mean-square of the offset-corrected digital output for the channel, the digital output being divided by the moving root-mean-square and multiplied by the moving root-mean-square of the data channel.

13. The nonlinear-error-corrected ADC of claim 12 wherein the gain corrector further divides the offset-corrected digital output by the moving root-mean-square to generate a normalized digital output for the channel.

14. The nonlinear-error-corrected ADC of claim 12 wherein the static error corrector further comprises:
a capacitor weights Look-Up Table (LUT) storing relative weights of capacitors in the ADC for the channel, the relative weights determined by execution of a capacitor weights calibration routine;
wherein activated digital bits in the digital output from the ADC are looked up in the capacitor weights LUT and their corresponding stored entries are summed to determine a weight-corrected digital output for the digital output of the channel to correct for capacitor weight mismatches.

15. The nonlinear-error-corrected ADC of claim 9 further comprising:
a Successive-Approximation calibrator, for each correlation sign in the sign vector
(a) adding a test bit-position to the SAR of a channel having a corresponding correlation sign in the sign vector having a value of 1;
(b) subtracting the test bit-position to the SAR of the channel having the corresponding correlation sign in the sign vector having a value of 0;
and repeating from (a) for successively smaller bit-positions in the SAR,
whereby the correlation sign in the sign vector is used to add or subtract successive bit-positions in the SAR.

16. The nonlinear-error-corrected ADC of claim 15 wherein the digital output from the ADC is at least 8 bits.

17. The nonlinear-error-corrected ADC of claim 3 further comprising:
a power comparator that compares the moving root-mean-square power of the data channel to a power threshold, and activates a disable signal when the moving root-mean-square power of the data channel is less than the power threshold;
wherein the nonlinear detector is disabled by the disable signal when power is low.

18. An Analog-to-Digital Converter (ADC) comprising:
an analog input;
a corrected digital output;
a plurality of channels including a data channel and a reference channel;
an attenuator that attenuates the analog input to generate an attenuated analog input that is input to the reference channel;
wherein each channel in the plurality of channels further comprises:
a channel ADC having a sampled analog input and a digital output;
a sampling switch between the analog input and the sampled analog input, the sampling switch responsive to a delayed clock;
a Successive-Approximation-Register (SAR) that stores a delay setting for the channel; and
a delay element adding a variable delay to a channel clock to generate a delayed clock, wherein the variable delay is determined by the delay setting in the SAR;
an offset corrector for averaging the digital output from the channel ADC to generate an offset-corrected digital output;
a gain corrector for generating a moving root-mean-square of the offset-corrected digital output and for dividing the offset-corrected digital output by the moving root-mean-square and multiplying by a moving root-mean-square of a first channel in the plurality of channels to generate a static-corrected digital output;
a channel correlator for correlating the static-corrected digital output from the channel to static-corrected digital outputs from adjacent channels in the plurality of channels to generate a correlation sign bit for the channel; and
a nonlinear channel corrector that adds a second harmonic distortion (HD2) term to the static-corrected digital output for the channel to generate the corrected digital output for the channel, and generates a normalized Y value by dividing the static-corrected digital output by a range of the static-corrected digital output, and generates the HD2 term by squaring the normalized Y value and multiplying by a HD2 coefficient;
a calibrator, using the correlation sign bit to decide when to add a test bit to the SAR for a channel, and when to remove the test bit from the SAR for the channel, wherein each correlation sign bit is for adding or removing a test bit from a SAR in a different channel in the plurality of channels;
a HD2 counter that is incremented by a sign bit of the corrected digital output from the nonlinear channel corrector for the data channel, the HD2 counter having a HD2 count value that is reset after M samples, wherein M is a whole number of at least 16384;
a HD2 cost function calculator that uses the HD2 count value to generate a HD2 cost function; and
a HD2 updater that updates the HD2 coefficient by subtracting a sign of the HD2 cost function multiplied by a HD2 stepsize from a prior value of the HD2 coefficient,
whereby HD2 errors are detected by counting sign bits of the corrected digital output of the data channel.

19. The ADC of claim 18 wherein the nonlinear channel corrector further adds a third harmonic distortion (HD3)

term to the static-corrected digital output for the channel to generate the corrected digital output for the channel, and further generates the HD3 term by cubing the normalized Y value and multiplying by a HD3 coefficient;

further comprising:
an order-shift generator that generates an order-shifted code by using an order-shifted function, the order-shifted function being derived from an equation that has the HD3 coefficient multiplied by an even power of the static-corrected digital output;
a HD3 counter that is incremented by a sign bit of the order-shifted code, the HD3 counter having a HD3 count value that is reset after M1 samples, wherein M1 is a whole number of at least 16384;
a HD3 cost function calculator that uses the HD3 count value to generate a HD3 cost function; and
a HD3 updater that updates the HD3 coefficient by subtracting a sign of the HD3 cost function multiplied by a HD3 stepsize from a prior value of the HD3 coefficient, whereby HD3 errors are detected by counting sign bits of the order-shifted code.

20. The ADC of claim 19 wherein the HD2 cost function calculator doubles the HD2 count value and subtracts M to generate the HD2 cost function;
wherein the HD3 cost function calculator doubles the HD3 count value and subtracts M1 to generate the HD3 cost function;
wherein the order-shift generator generates the order-shifted code by generating a difference of the corrected digital output from the nonlinear channel corrector for the data channel and the static-corrected digital output for the reference channel, and multiplies the difference by the static-corrected digital output for the reference channel to generate the order-shifted code;
further comprising:
an HD2 averager that averages the HD2 coefficient; and
an HD3 averager that averages the HD3 coefficient.

* * * * *